(12) United States Patent
Govil et al.

(10) Patent No.: US 8,204,703 B2
(45) Date of Patent: Jun. 19, 2012

(54) MEASUREMENT AND APPARATUS FOR ELECTRICAL MEASUREMENT OF ELECTRICAL DRIVE PARAMETERS FOR A MEMS BASED DISPLAY

(75) Inventors: Alok Govil, Santa Clara, CA (US);
Kostadin Djordjev, San Jose, CA (US);
Alan Lewis, Sunnyvale, CA (US);
Wilhelmus Johannes Robertus Van Lier, San Diego, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 582 days.

(21) Appl. No.: 12/369,679

(22) Filed: Feb. 11, 2009

(65) Prior Publication Data
US 2009/0204349 A1    Aug. 13, 2009

Related U.S. Application Data

(60) Provisional application No. 61/027,770, filed on Feb. 11, 2008.

(51) Int. Cl.
*G06R 19/00* (2006.01)
*G06F 19/00* (2011.01)

(52) U.S. Cl. ........... 702/64; 341/152; 345/108; 702/117

(58) Field of Classification Search .................... 702/64, 702/65, 104, 117; 73/514.16, 514.38, 580; 324/73.1, 117 R, 658, 671; 341/152; 345/54; 359/254, 290, 291, 298, 318; 361/207
See application file for complete search history.

(56) References Cited

U.S. PATENT DOCUMENTS

| | | | |
|---|---|---|---|
| 4,954,789 | A | 9/1990 | Sampsell |
| 5,305,640 | A | 4/1994 | Boysel et al. |
| 5,526,688 | A | 6/1996 | Boysel et al. |
| 5,550,373 | A | 8/1996 | Cole et al. |
| 5,551,293 | A | 9/1996 | Boysel et al. |
| 5,784,189 | A | 7/1998 | Bozler et al. |
| 6,040,937 | A | 3/2000 | Miles |
| 6,275,326 | B1 | 8/2001 | Bhalla et al. |
| 6,320,394 | B1 | 11/2001 | Tartagni |
| 6,356,085 | B1 | 3/2002 | Ryat et al. |
| 6,392,233 | B1 | 5/2002 | Channin et al. |
| 6,480,645 | B1 | 11/2002 | Peale et al. |
| 6,545,495 | B2 | 4/2003 | Warmack et al. |
| 6,574,033 | B1 | 6/2003 | Chui et al. |

(Continued)

FOREIGN PATENT DOCUMENTS

EP     1 630 781     3/2006

(Continued)

OTHER PUBLICATIONS

Invitation to Pay Additional Fees in PCT/US09/033465, dated Mar. 11, 2010.

(Continued)

*Primary Examiner* — John H Le
(74) *Attorney, Agent, or Firm* — Knobbe Martens Olson & Bear, LLP

(57) ABSTRACT

Methods and devices to measure threshold voltages of electro-mechanical systems devices are disclosed. The threshold voltages are determined based on which of multiple test voltages cause the devices to change states. State changes of the device are detected by monitoring integrated current or charge used to drive the test voltages.

168 Claims, 21 Drawing Sheets

U.S. PATENT DOCUMENTS

| | | | |
|---|---|---|---|
| 6,674,383 B2 * | 1/2004 | Horsley et al. | 341/152 |
| 6,674,562 B1 | 1/2004 | Miles et al. | |
| 6,680,792 B2 | 1/2004 | Miles | |
| 6,788,520 B1 | 9/2004 | Behin et al. | |
| 7,123,216 B1 | 10/2006 | Miles | |
| 7,126,741 B2 | 10/2006 | Wagner et al. | |
| 7,161,728 B2 | 1/2007 | Sampsell et al. | |
| 7,327,510 B2 | 2/2008 | Cummings et al. | |
| 7,551,159 B2 * | 6/2009 | Mignard et al. | 345/108 |
| 2001/0051014 A1 | 12/2001 | Behin et al. | |
| 2002/0093446 A1 | 7/2002 | Horsley et al. | |
| 2003/0020699 A1 | 1/2003 | Nakatani et al. | |
| 2006/0044298 A1 | 3/2006 | Mignard et al. | |
| 2006/0044928 A1 | 3/2006 | Chui et al. | |
| 2006/0067652 A1 | 3/2006 | Cummings et al. | |
| 2007/0075942 A1 | 4/2007 | Martin et al. | |
| 2009/0224748 A1 | 9/2009 | Mignard et al. | |

FOREIGN PATENT DOCUMENTS

| | | |
|---|---|---|
| WO | WO 01/73937 | 10/2001 |
| WO | WO 02/086582 | 10/2002 |

OTHER PUBLICATIONS

Seeger et al., Oct. 2003, Charge control of parallel-plate, electrostatic actuators and the tip-in instability, Journal of Microelectromechanical Systems, 12(5):657-671.

ISR and WO in PCT/US09/033465, dated Jul. 2, 2010.

IPRP in PCT/US09/033465, dated Aug. 26, 2010.

Miles, MEMS-based interferometric modulator for display applications, Part of the SPIE Conference on Micromachined Devices and Components, vol. 3876, pp. 20-28 (1999).

Miles et al., 5.3: Digital Paper™: Reflective displays using interferometric modulation, SID Digest, vol. XXXI, 2000 pp. 32-35.

* cited by examiner

| | Column Output Signals | |
|---|---|---|
| | $+V_{bias}$ | $-V_{bias}$ |
| Row Output Signals  0 | Stable | Stable |
| $+\Delta V$ | Relax | Actuate |
| $-\Delta V$ | Actuate | Relax |

MEASUREMENT AND APPARATUS FOR ELECTRICAL MEASUREMENT OF ELECTRICAL DRIVE PARAMETERS FOR A MEMS BASED DISPLAY

CROSS REFERENCE TO RELATED APPLICATIONS

This application claims priority to U.S. Provisional Application No. 61/027,770, titled "Measurement And Apparatus For Electrical Measurement Of Electrical Drive Parameters For A Mems Based Display," filed Feb. 11, 2008, which is hereby incorporated by reference, in its entirety.

BACKGROUND

1. Field of the Invention

The field relates to microelectromechanical systems (MEMS), and more particularly to methods and systems for measurement of electrical parameters of MEMS devices.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

One aspect is a method of measuring a threshold voltage for a MEMS device. The method includes applying a plurality of voltage transitions to the device and sensing an amount of charge applied to the device during one or more transitions, determining, based on the amount of charge sensed, whether each of the one or more transitions changes the state of the device, and determining the threshold voltage based at least in part on a transition resulting in a state change.

Another aspect is a method of measuring a margin for a microelectromechanical system (MEMS) device, the method including initializing the elements of the array to a first state, applying a positive hold voltage to a first portion of the array, applying a negative hold voltage to a second portion of the array, while applying the positive and negative hold voltages, applying a test pulse to the elements of the array, applying a negative voltage transition to the first portion of the array to apply the negative hold voltage to the first portion of the array, applying a positive voltage transition to the second portion of the array to apply the positive hold voltage to the second portion of the array, sensing a difference between charge induced by the positive voltage transition and charge induced by the negative voltage transition to determine whether the test pulse changed the state of one or more elements of the array, and determining the margin based on whether the test pulse changed the state of one or more elements of the array.

Another aspect is a MEMS device configured to be driven to an actuated state as a result of being driven with an actuation voltage, to be driven to a released state as a result of being driven with a release voltage, and to maintain a current state as a result of being driven with a hold voltage. The device includes first and second means for actuating and releasing according to a voltage, means for applying a plurality of voltage transitions to the first and second actuating and releasing means, means for indicating an amount of charge applied to the device during one or more transitions, means for determining, based on the amount of charge sensed, whether each of the one or more transitions changes the state of the device, and means for determining the threshold voltage based at least in part on a transition resulting in a state change.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Embodiments provide methods and devices to measure threshold voltages of MEMS devices. The threshold voltages can be used to determine voltages with which the devices are driven during operation. While approximate threshold voltages are known from design parameters, measurement of the threshold voltages with better precision than the approximations allows for optimal operation of the devices.

Figure 1:
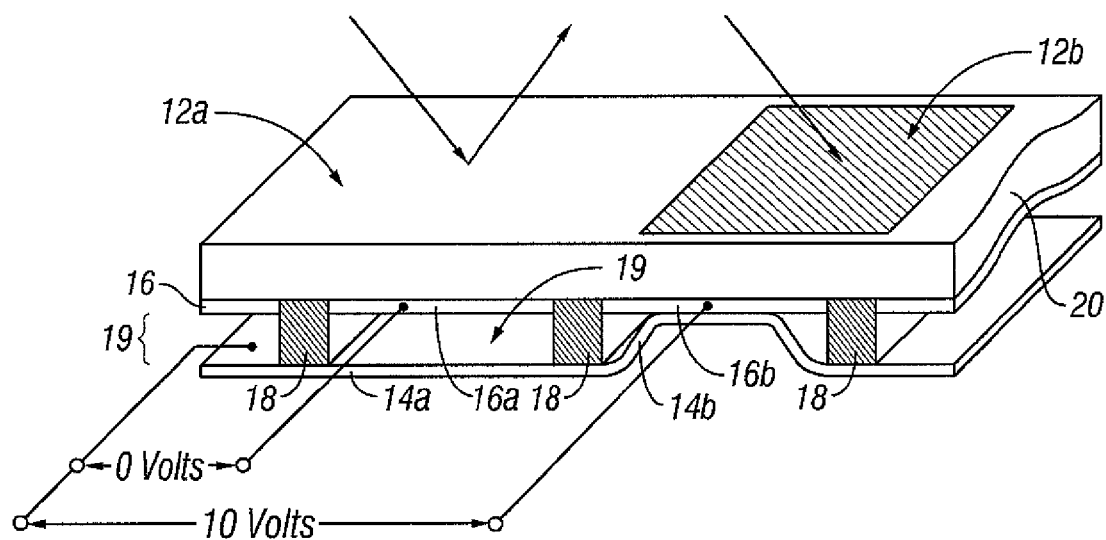
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
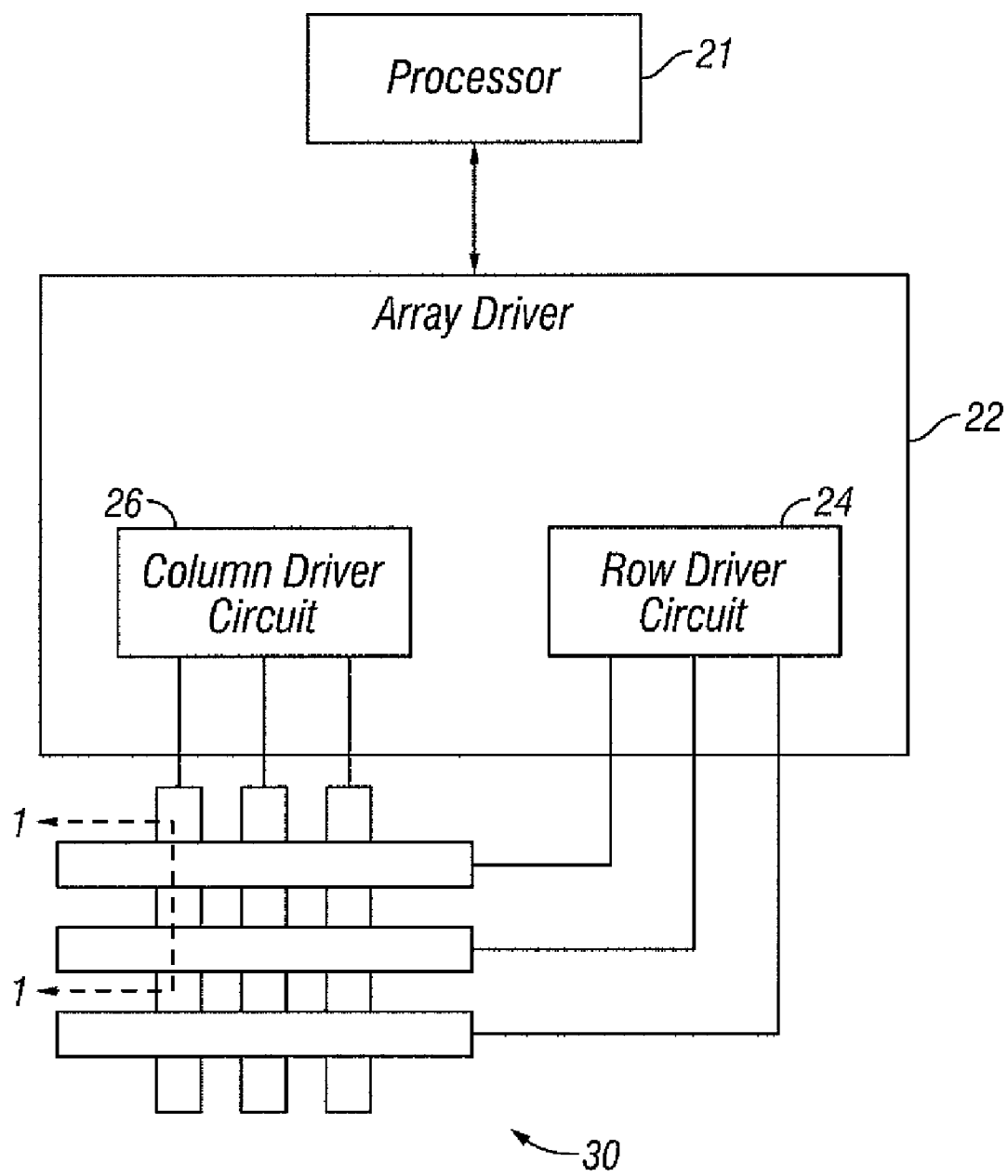
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
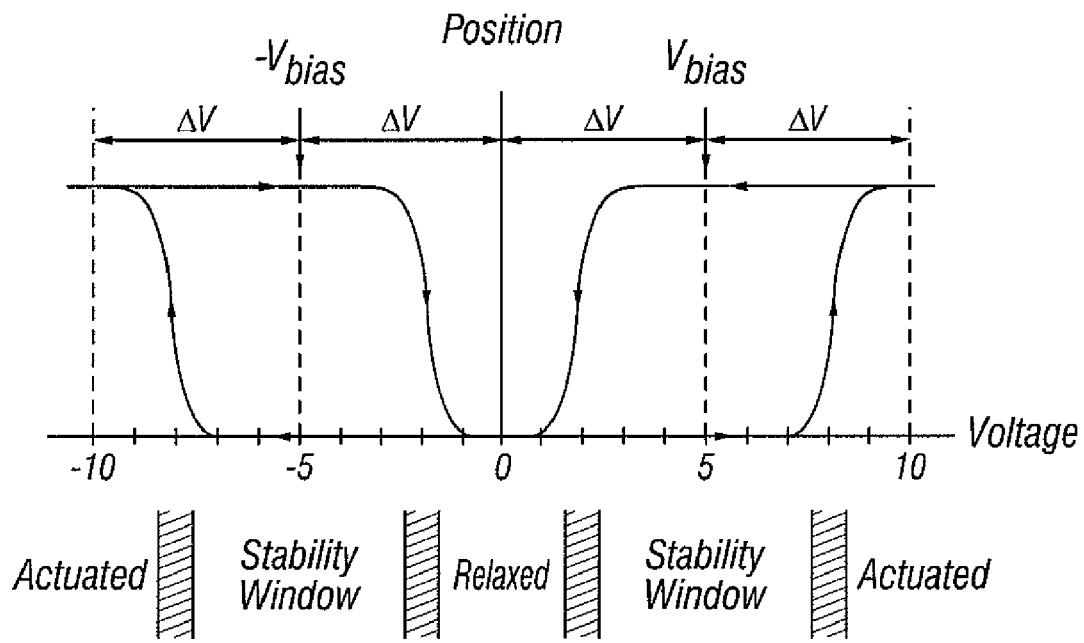
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
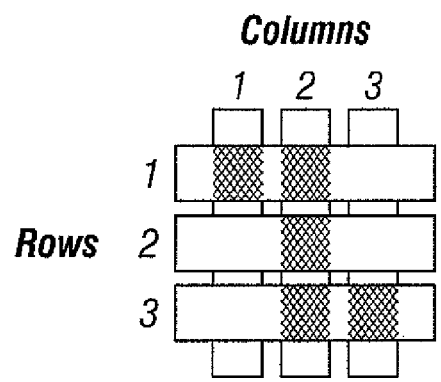
FIG. 5A illustrates one exemplary frame of display data in the 3×3 interferometric modulator display of FIG. 2.
Figure 5B:
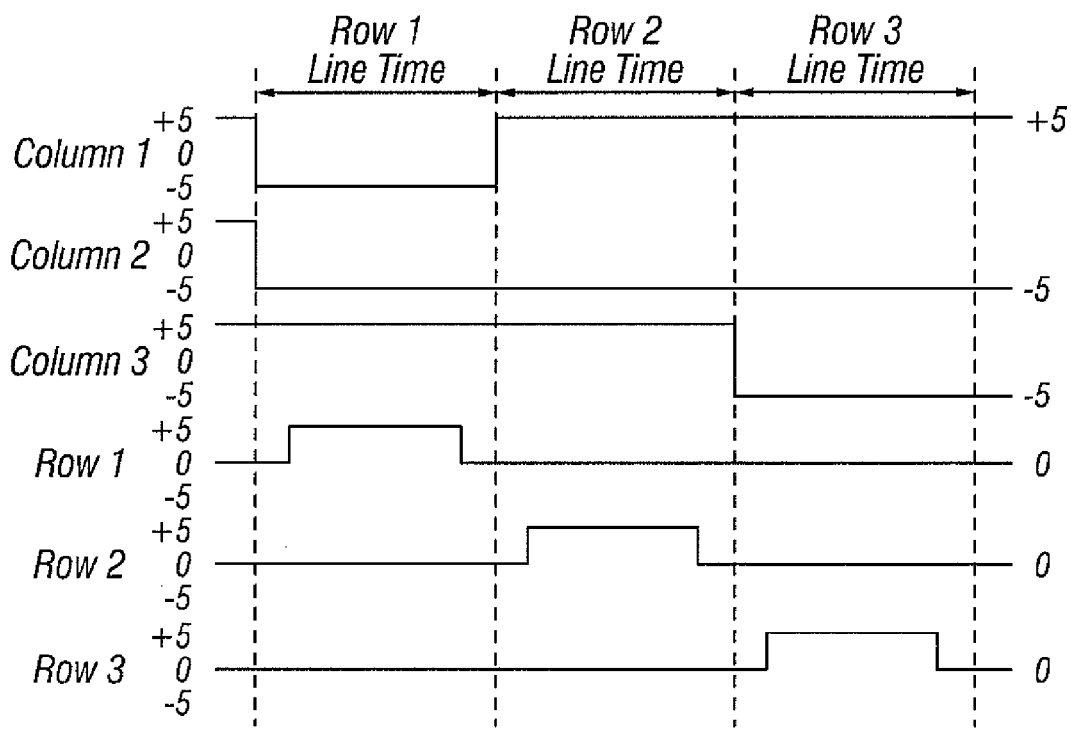
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
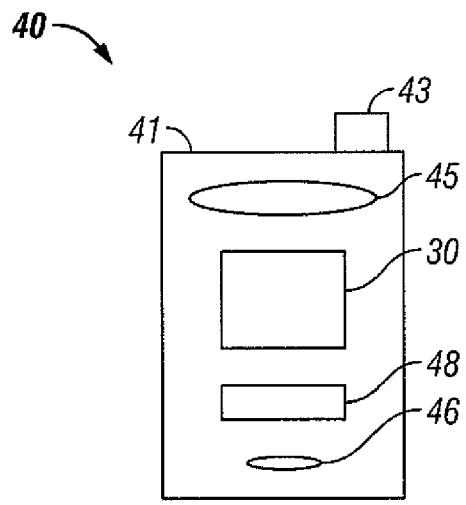
FIGS. 6A and 6B are system block diagrams illustrating an embodiment of a visual display device comprising a plurality of interferometric modulators.
Figure 6B:
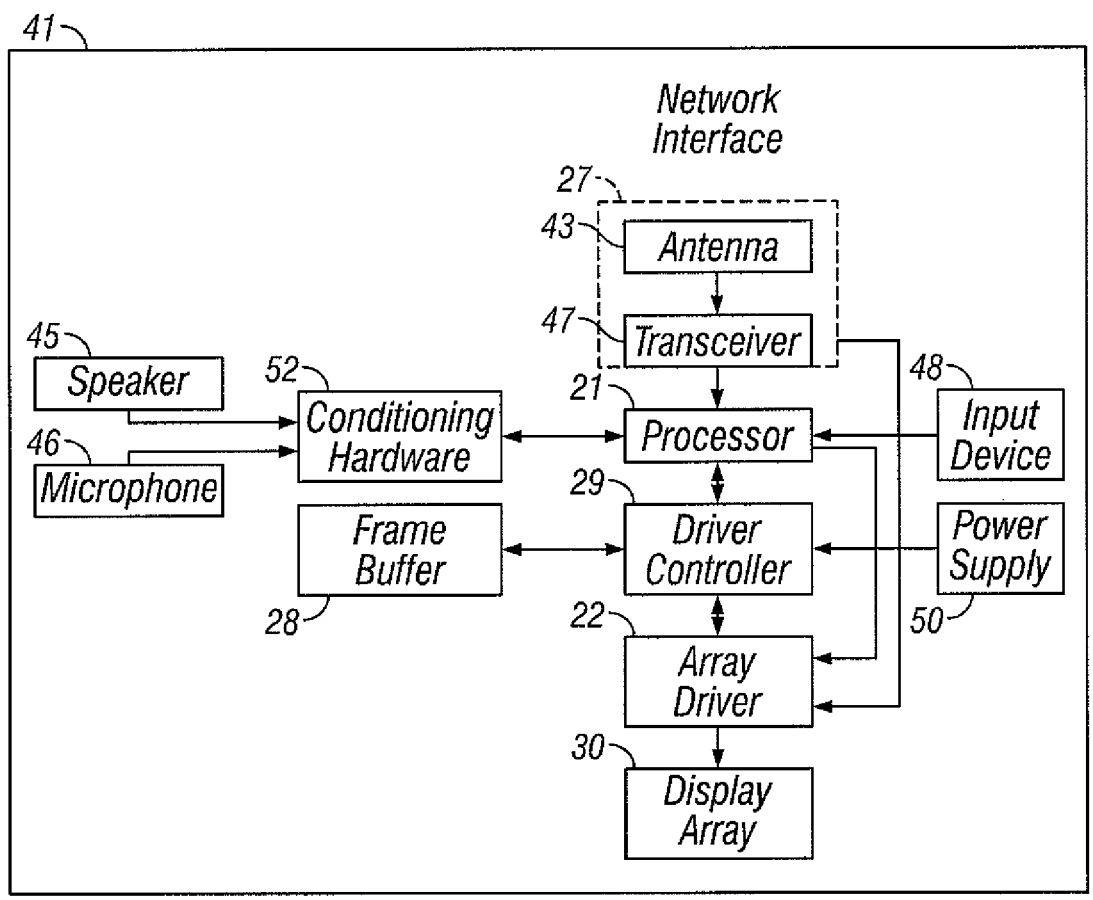

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
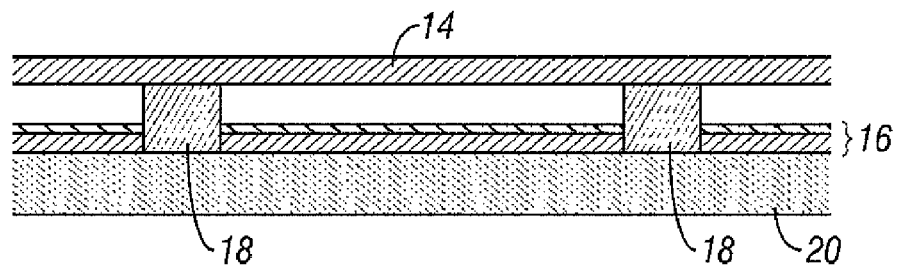
FIG. 7A is a cross section of the device of FIG. 1.
Figure 7B:
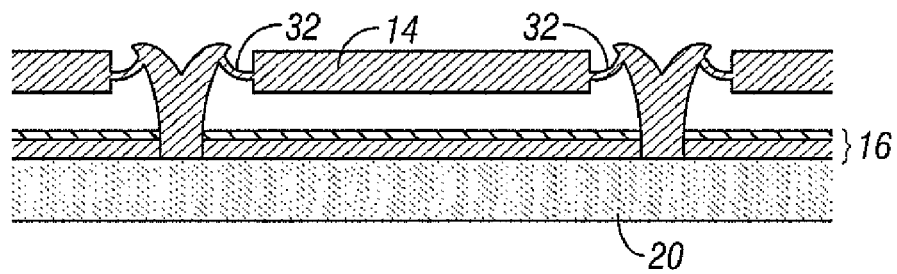
FIG. 7B is a cross section of an alternative embodiment of an interferometric modulator.
Figure 7C:
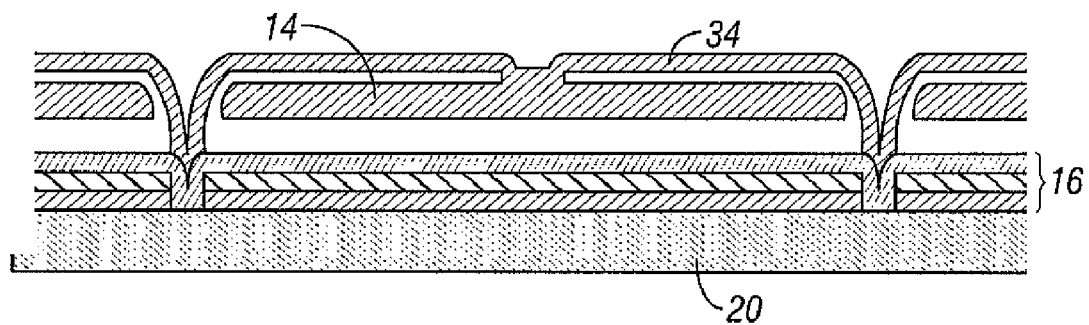
FIG. 7C is a cross section of another alternative embodiment of an interferometric modulator.
Figure 7D:
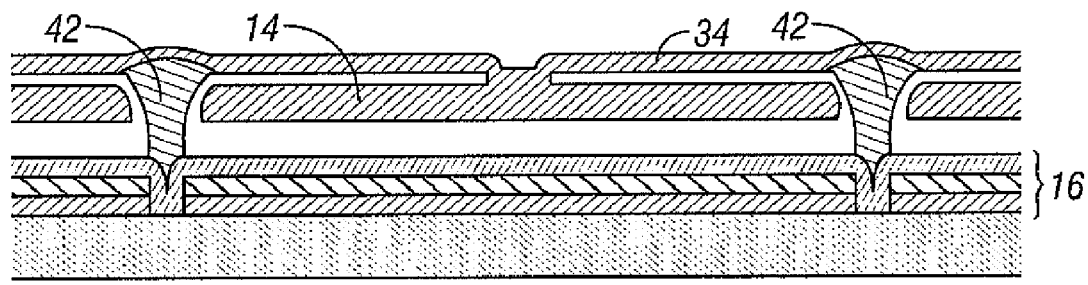
FIG. 7D is a cross section of yet another alternative embodiment of an interferometric modulator.
Figure 7E:
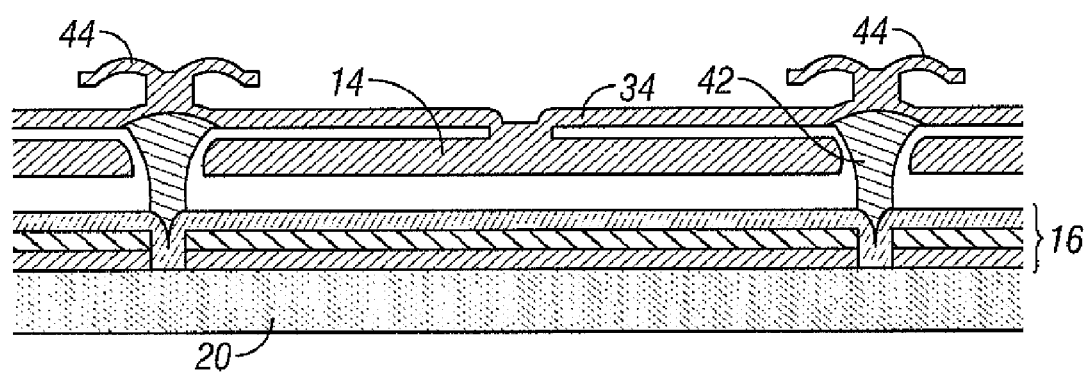
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

The following description is directed to methods and devices used for the measurement of threshold voltages of a wide variety of MEMS elements, such as MEMS switches, and other elements having deflected or deformed mirrors. Although the specific examples discussed use interferometric modulators as the elements, the principles discussed apply to other MEMS elements as well.

After an array of interferometric modulators is manufactured, the interferometric modulators are tested to verify their proper operation. As discussed above with reference to FIG. 3, the interferometric modulators operate based on a potential difference applied to them. FIG. 3 shows that the interferometric modulators are in either the relaxed (or released) state or in the actuated state, depending on the magnitude of the potential difference applied to them. As shown, the changing of one state to another happens according to a hysteretic characteristic with a stability (or hold) window, where the device holds its current state when the applied potential difference falls within the hold window. Accordingly, as shown in FIG. 3, there are five input voltage difference ranges. Each of the five voltage difference ranges has a title reflecting its effect on the state of the interferometric modulator. Starting from the left of FIG. 3, the five voltage difference ranges are: 1) negative actuate ("Actuated"); 2) negative hold ("Stability Window"); 3) release ("Relaxed"); 4) positive hold ("Stability Window"); and 5) positive actuate ("Actuated"). Based on theoretical understanding of the devices and past experimental results, approximate values of the thresholds between these input voltage difference ranges are known, but in order to more optimally operate the interferometric modulator array, the threshold voltages can be measured with more precision than the approximate values. Threshold values may be measured for each manufactured device or group of devices. One method of measuring the threshold voltages is to apply inputs of various voltage differences while monitoring the state of the interferometric modulators through observation of the optical characteristics of the interferometric modulators. This may be accomplished, for example, through human observation or by use of an optical measurement device. Additionally or alternatively, the state of the interferometric modulators may be monitored through electronic measurement. In some embodiments, the driver chip of the display may be configured to measure threshold voltages according to the methods discussed below.

Interferometric modulators, such as any of those illustrated in FIGS. 7A-7E, have various thresholds of interest. These thresholds include positive and negative DC release thresholds, positive and negative DC actuation thresholds, positive and negative flash release thresholds, positive and negative flash actuation thresholds, positive and negative crosstalk release thresholds, and positive and negative crosstalk actuation thresholds.

A DC release threshold is a threshold between either the positive or the negative hold input voltage difference range and the release input voltage difference range, and is determined by applying a test voltage across the two electrodes of an actuated interferometric modulator, and determining whether the interferometric modulator releases as a result of the test voltage. The positive DC release threshold is determined using an interferometric modulator that has been initialized to an actuated state with a positive actuation input voltage difference across the two electrodes. The input voltage difference is reduced and the state of the interferometric modulator is determined. The positive DC release threshold is the maximum positive input voltage difference applied to the interferometric modulator resulting in the release of the interferometric modulator. The negative DC release threshold is determined using an interferometric modulator that has been initialized to an actuated state with a negative actuation input voltage difference across the two electrodes. The input voltage difference is increased and the state of the interferometric modulator is determined. The negative DC release threshold is the minimum negative input voltage difference applied to the interferometric modulator resulting in the release of the interferometric modulator.

A DC actuation threshold is a threshold between either the positive or the negative hold input voltage difference range and the positive or negative actuation input voltage difference range, respectively. A DC actuation threshold is determined using an interferometric modulator initialized with an input voltage difference causing the interferometric modulator to be released. The positive DC actuation voltage is measured by increasing the input voltage difference across the two electrodes of the released interferometric modulator, and determining whether the interferometric modulator actuates as a result of the input voltage difference. The positive DC actuation threshold is the minimum positive input voltage difference applied across the two electrodes of the interferometric modulator resulting in the actuation of the interferometric modulator. The negative DC actuation voltage is measured by decreasing the input voltage difference across the two electrodes of the released interferometric modulator, and determining whether the interferometric modulator actuates as a result of the input voltage difference. The negative DC actuation threshold is the maximum negative input voltage difference applied to the interferometric modulator resulting in the actuation of the interferometric modulator.

The operational thresholds of an interferometric modulator element are usually different than the DC thresholds. For example, if a voltage large enough to actuate an interferometric modulator, if applied for a certain minimum duration, is applied to the interferometric modulator for a time less than the minimum duration, the interferometric modulator may not actuate. In this case, the magnitude of the operational actuation threshold is higher than the DC actuation threshold. As another example, hold voltages of opposite polarities are often sequentially applied to an interferometric modulator with the intention that the interferometric modulator remain in its current state. The alternating polarity signal helps to prevent charge build-up which would occur if a single hold voltage were applied. If the applied hold voltages are too close to the DC release thresholds, the interferometric modulator may transition to the released state even when the applied hold voltages are within the hold window. This happens because during the transition from a hold voltage of one polarity to a hold voltage of opposite polarity, the applied voltage passes through the release input voltage difference range for a very short time. In this case, the magnitude of the operational release threshold voltage is larger than the magnitude of the DC release threshold.

A flash release threshold is a threshold between either the positive or the negative hold input voltage difference range and the release input voltage difference range, and is determined by applying a test input voltage difference across the two electrodes of an actuated interferometric modulator, and determining whether the interferometric modulator releases as a result of the test input voltage difference. The positive flash release threshold is determined with an actuated interferometric modulator. A positive voltage difference transition starting from a negative hold voltage and ending at a positive test voltage difference is applied to the interferometric modulator. The positive flash release threshold is the maximum positive test voltage difference applied to the interferometric modulator resulting in the release of the interferometric modulator. The negative flash release threshold is determined with an actuated interferometric modulator. A negative voltage difference transition starting from a positive hold voltage and ending at a negative test voltage is applied to the interferometric modulator. The negative flash release threshold is the minimum negative test voltage difference applied to the interferometric modulator resulting in the release of the interferometric modulator.

A flash actuation threshold is a threshold between either the positive or the negative hold input voltage difference range and the positive or negative actuation input voltage difference range, respectively. A flash actuation threshold is determined by applying a test voltage difference to a released interferometric modulator, and determining whether the interferometric modulator actuates as a result of the test voltage. The positive flash actuation threshold is measured by applying to the interferometric modulator a positive voltage difference transition starting from a negative hold voltage and ending at a positive test voltage difference. The positive flash actuation threshold is the minimum positive test voltage difference applied to the interferometric modulator resulting in the actuation of the interferometric modulator. The negative flash actuation threshold is measured by applying to the interferometric modulator a negative voltage difference transition starting from a positive hold voltage and ending at a negative test voltage. The negative flash actuation threshold is the maximum negative test voltage applied to the interferometric modulator resulting in the actuation of the interferometric modulator.

Crosstalk thresholds are voltage threshold values between hold input voltage difference ranges and release and actuation input voltage difference ranges, respectively. Crosstalk threshold values are different from corresponding DC threshold values because when driving signals are applied to one interferometric modulator, another interferometric modulator may change its state. Because of non-zero impedances of the signal lines of an interferometric modulator array, if a first interferometric modulator is held with a voltage near a DC actuation or release voltage, when another interferometric modulator is driven, the driving signal may couple onto the signal lines of the first interferometric modulator so that the first interferometric modulator undesirably changes states.

A crosstalk release threshold is a threshold between either the positive or the negative hold input voltage difference range and the release input voltage difference range, and is determined by applying a test voltage difference to a test interferometric modulator and applying a driving voltage to another interferometric modulator, and determining whether the test interferometric modulator releases as a result of the driving voltage. The positive crosstalk release threshold is determined with the test interferometric modulator actuated and held with a positive test voltage difference. The positive crosstalk release threshold is the minimum positive test voltage difference applied to the test interferometric modulator resulting in the interferometric modulator not releasing when the other interferometric modulator is driven so as to change states. The negative crosstalk release threshold is determined with the test interferometric modulator actuated and held with a negative test voltage difference. The negative crosstalk release threshold is the maximum negative test voltage difference applied to the test interferometric modulator resulting in the interferometric modulator not releasing when the other interferometric modulator is driven so as to change states.

A crosstalk actuation threshold is a threshold between either the positive or the negative hold input voltage difference range and the positive or negative actuation voltage difference range, respectively. A crosstalk actuation threshold is determined by applying a test voltage difference to a test interferometric modulator while applying a driving voltage to another interferometric modulator such that the other interferometric modulator changes states, and determining whether the test interferometric modulator releases as a result of the driving voltage. The positive crosstalk release threshold is determined with the test interferometric modulator actuated and held with a positive hold voltage difference. The positive crosstalk release threshold is the minimum positive test voltage difference applied to the test interferometric modulator resulting in the interferometric modulator not releasing when the other interferometric modulator is driven so as to change states. The negative crosstalk release threshold is determined with the test interferometric modulator actuated and held with a negative hold voltage difference. The negative crosstalk release threshold is the maximum negative test voltage difference applied to the test interferometric modulator resulting in the interferometric modulator not releasing when the other interferometric modulator is driven so as to change states.

As discussed above, the interferometric modulator goes to the actuated state when the electrostatic attraction between the reflective layer and the optical stack is great enough to overcome the mechanical restorative forces working to hold the reflective layer in the relaxed state. Because the reflective layer, the optical stack, and the gap between them form two conductive plates separated by a dielectric, the structure has a capacitance. Also, because the capacitance of the structure varies according to the distance between the two plates, the capacitance of the structure varies according to the state of the interferometric modulator. Therefore, an indication of the capacitance can be used to determine the state of the interferometric modulator.

An indication of the capacitance can be obtained, for example, by sensing the current or charge used to change the voltage applied between the reflective layer and the optical stack. A relatively high amount of current or charge indicates that the capacitance is relatively large. Similarly, a relatively low amount of current or charge indicates that the capacitance is relatively small. The sensing of current or charge may be accomplished, for example through analog or digital integration of a signal representing the charge or current.

FIGS. 8A-8D and 9A-9B show embodiments of stimulus input electrical wave forms and measured responses, which can be used to determine the state of the device after the stimuli are applied. FIGS. 8A-8D and 9A-9B show that various thresholds of the device can be measured using the wave forms and measured responses. After discussion of FIGS. 8A-8D and 9A-9B, FIGS. 10A-12 are used to demonstrate embodiments in which similar input electrical wave forms are used to determine certain specific thresholds.

Various methods of determining threshold voltages may be implemented by test drivers to determine thresholds as part of a pass/fail judgment of displays as part of the manufacturing process. However, thresholds may alternatively or additionally be determined once a display is connected to a dedicated driver in a manufactured device. For example, in some embodiments, a driver is configured to determine thresholds in response to a signal indicating that the device has been turned on. In some embodiments, the driver is additionally or alternatively configured to determine thresholds while the device is being used. In some embodiments, the threshold measurements are substantially periodic. In some embodiments, thresholds are determined in response to a change in environmental conditions sensed by a circuit. This is particularly advantageous, because thresholds may shift for various reasons including temperature and ageing.

Figure 8A:
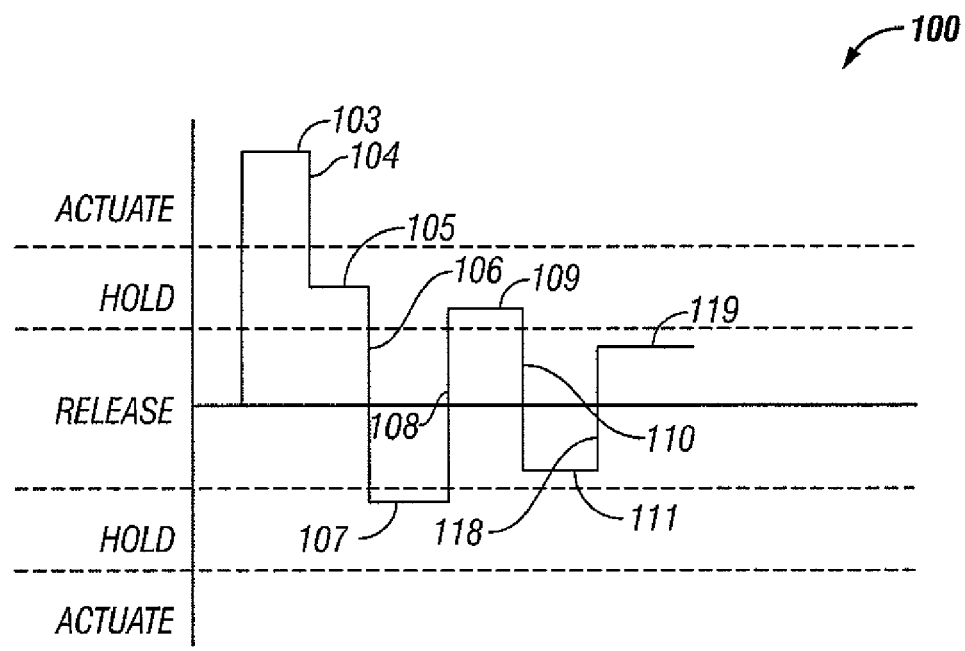
FIGS. 8A-8D are waveforms of input signals and integrated responses to the signals used for measuring thresholds.

FIG. 8A depicts an input electrical wave form 100 which varies among the input voltage difference ranges in a certain test embodiment. FIG. 5B depicts a measured response which can be used to determine whether the interferometric modulator is in the actuated or in the released state. In this embodiment, wave form 100 is applied to an interferometric modulator to determine a threshold voltage between two input voltage difference ranges—the negative hold voltage difference and the negative release voltage difference—by monitoring the measured response of FIG. 8B. As discussed below in further detail, the method of determining the threshold using wave form 100 includes initializing the interferometric modulator to an actuated state, applying a first hold voltage difference, and then applying a series of voltage differences of opposite polarities and of successively decreasing magnitude. The state of the device is determined during the time of each of the series of applied voltage differences by monitoring the current or charge used to apply the voltage difference. When the interferometric modulator changes to the released state, the currently applied voltage difference is used to determine the threshold between the hold voltage difference range and the release voltage difference range.

Transition 102 brings the input voltage difference to voltage level 103 to initialize the interferometric modulator to an actuated state. The value of voltage level 103 is determined based on theoretical understanding of the interferometric modulator and previous experimentation, and is of sufficient magnitude that actuation of the interferometric modulator is expected. The voltage level 103 is of sufficient duration that the interferometric modulator has time to go into the actuated state.

Transition 104 brings the input voltage difference to voltage level 105. The value of voltage level 105 is determined based on theoretical understanding of the interferometric modulator and previous experimentation, and is of such a magnitude that the interferometric modulator is expected to hold its current state.

From this point on, a series of positive and negative voltage difference transitions of successively decreasing magnitude is applied to the interferometric modulator. Once the interferometric modulator goes to a released state, the threshold can be determined based at least in part on the voltage difference applied to the interferometric modulator.

Figure 8B:
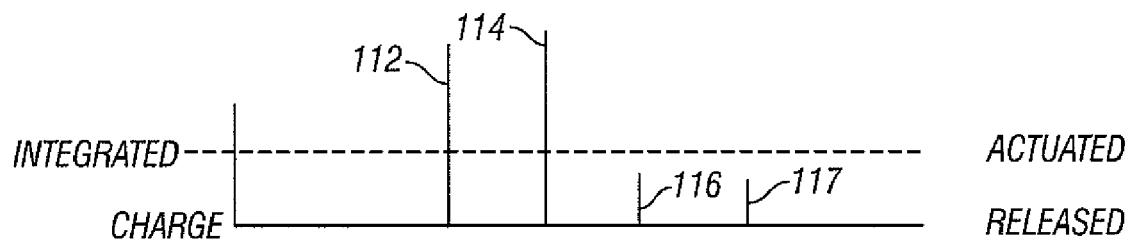

Transition 106 brings the input potential to voltage level 107. Voltage level 107, as indicated in FIG. 8A, is below the still unknown negative release/hold threshold. Accordingly, the interferometric modulator does not release. The current or charge needed to drive the transition 106 is sensed and shown graphically as integrated charge 112 in FIG. 8B. Also shown in FIG. 8B, the integrated charge 112 is above the actuated/released charge threshold, indicating that the capacitance of the interferometric modulator is high, revealing that the interferometric modulator is still in the actuated state. Transition 108 brings the input voltage difference to voltage level 109. Similarly, because the voltage level 109 is above the still unknown positive release/hold threshold, the current or charge needed to drive the transition 108, integrated charge 114, is also above the actuated/released charge threshold, revealing that the interferometric modulator is still in the actuated state. Transition 110 brings the input potential to voltage level 111, and the current or charge needed to drive the transition 110 is sensed and shown graphically as integrated charge 116. As shown in FIG. 8B the integrated charge 116 is below the actuated/released charge threshold, revealing that the interferometric modulator has gone to the released state.

According to the embodiment, transition 106 from voltage level 105 to voltage level 107 did not release the interferometric modulator, and transition 110 from voltage level 109 to 111 did release the interferometric modulator. Accordingly, it is learned that the negative threshold voltage to release the device is between voltage level 107 and voltage level 111. If the interferometric modulator had not been released at voltage level 111, it may have released after transition 118 at voltage level 119. If this had been the case, it would have been learned that the positive threshold voltage to release the interferometric modulator would be between voltage level 109 and voltage level 119.

The resolution of this and other threshold voltage measurements may be arbitrarily determined based on, for example, the step sizes of the differences in the magnitudes of the series of applied transitions. In some embodiments, a binary search methodology, or another search method may be used. In some embodiments, the threshold voltage is substantially equal to the input voltage difference causing the interferometric modulator to change states.

Figure 8C:
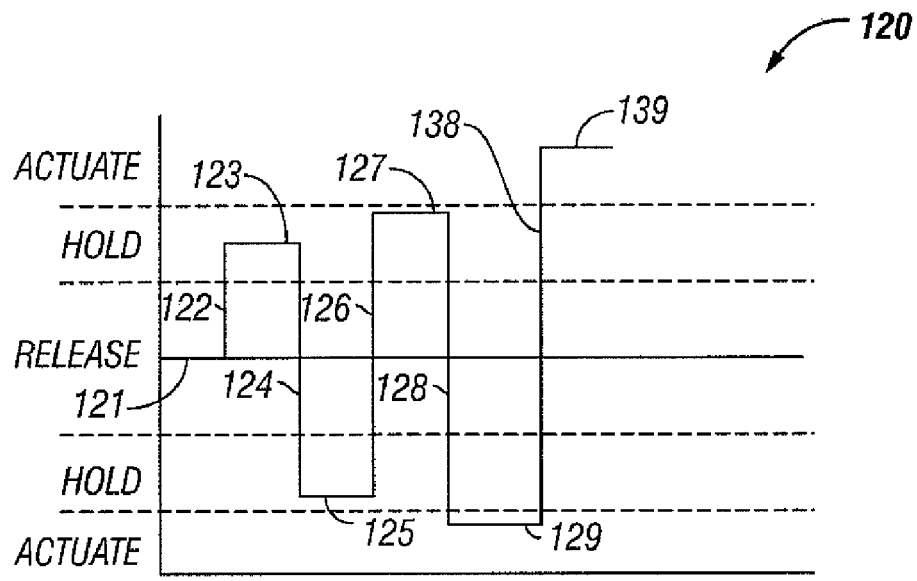
Figure 8D:
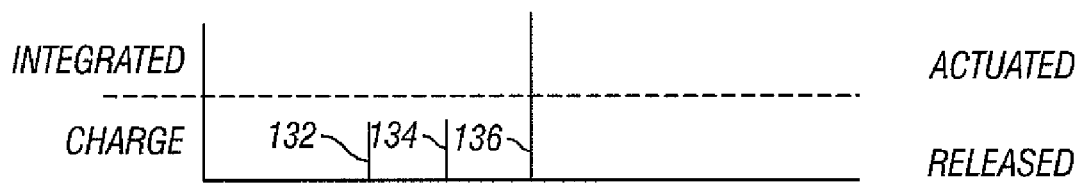

FIG. 8C depicts an input electrical wave form 120 which varies among the input voltage difference ranges in a certain test embodiment. FIG. 8D depicts a measured response which can be used to determine whether the interferometric modulator is in the actuated or in the released state. In this embodiment, wave form 120 is applied to an interferometric modulator to determine a threshold voltage between two input voltage difference ranges—the negative hold voltage and the negative actuate voltage—by monitoring the measured response of FIG. 8D. As discussed below in further detail, the method of measuring the threshold using wave form 120 includes initializing the interferometric modulator to a released state, applying a first hold voltage, and then applying a series of voltage differences of opposite polarities and of successively increasing magnitude. The state of the device is determined during the time of each of the series of applied voltage differences by monitoring the current or charge used to apply the voltage. When the interferometric modulator changes to the actuated state, the currently applied voltage is used to determine the threshold between the hold voltage and the actuation voltage.

Initial voltage level 121 is used to initialize the interferometric modulator to a released state. The value of voltage level 121 is determined based on theoretical understanding of the interferometric modulator and previous experimentation, and is of such a magnitude that the interferometric modulator is expected to be in a released state. Transition 122 brings the input potential to voltage level 123. The value of voltage level 123 is determined based on theoretical understanding of the interferometric modulator and previous experimentation, and is of such a magnitude that the interferometric modulator is expected to hold its current released state.

From this point, a series of positive and negative transitions of successively increasing magnitude is applied to the interferometric modulator. Once the interferometric modulator goes to an actuated state, the threshold can be determined, Transition 124 brings the input potential to voltage level 125. Voltage level 125, as indicated in FIG. 8C is above the still unknown negative actuate/hold threshold. Accordingly, the interferometric modulator does not actuate. The current or charge needed to drive the transition 124 is sensed and shown graphically as integrated charge 132. As shown in FIG. 8D, the integrated charge 132 is below the actuated/released charge threshold, indicating that the capacitance of the interferometric modulator is low, revealing that the interferometric modulator is still in the released state. Transition 126 brings the input potential to voltage level 127. Similarly, because the voltage level 127 is below the still unknown positive actuate/hold threshold, the current or charge needed to drive the transition 108, integrated charge 134 is below the actuated/released charge threshold, revealing that the interferometric modulator is still in the released state. Transition 128 brings the input potential to voltage level 129, and the current or charge needed to drive the transition 128 is sensed and shown graphically as integrated charge 134 in FIG. 8D. The integrated charge 134 is above the actuated/released charge threshold, revealing that the interferometric modulator has gone to the actuated state.

According to this embodiment, transition 124 from voltage level 123 to voltage level 125 did not actuate the interferometric modulator, and transition 128 from voltage level 127 to 129 did actuate the interferometric modulator. Accordingly, it is learned that the negative threshold voltage to actuate the device is between voltage level 125 and voltage level 129. If the interferometric modulator had not been actuated at voltage level 129, it may have been actuated after transition 138 at voltage level 139. If this had been the case, it would have been learned that the positive threshold voltage to actuate the interferometric modulator would be between voltage level 127 and voltage level 139.

Figure 9A:
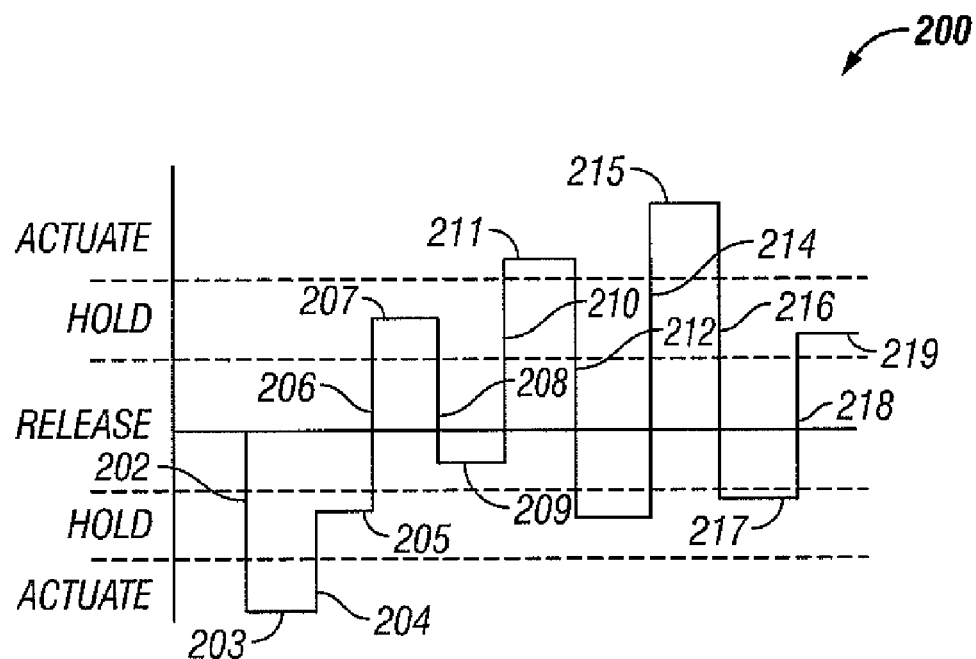
FIGS. 9A and 9B are waveforms used for measuring multiple thresholds.
Figure 9B:
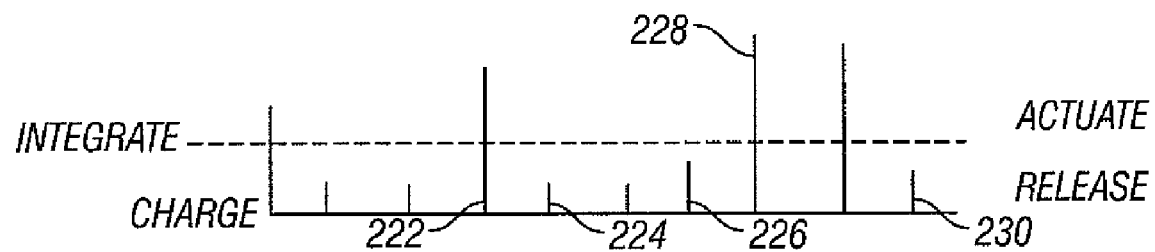

In some embodiments, multiple thresholds can be determined. FIG. 9A depicts an input electrical wave form 200 which varies among the input voltage difference ranges in a certain test embodiment. FIG. 9B depicts a measured response which can be used to determine whether the interferometric modulator is in the actuated or in the released state. The wave form 200 and the measured response of FIG. 9B are used to determine three thresholds—the negative flash release threshold, the positive flash actuation threshold, and the positive flash release threshold. As discussed below in further detail, the method of determining the thresholds using wave form 200 includes initializing the interferometric modulator to an actuated state, applying a first hold voltage, and then applying a series of voltages of opposite polarities and of successively decreasing magnitude. The state of the device is determined during the time of each of the series of applied voltages by monitoring the current or charge used to apply the voltage. When the interferometric modulator changes to the released state, the currently applied voltage is used to determine the threshold between the hold voltage and the release voltage. Then, because the device is in the released state an actuation voltage can next be measured. A series of voltages of opposite polarities and of successively increasing magnitude is applied. The state of the device is determined during the time of each of the series of applied voltages by monitoring the current or charge used to apply the voltage. When the interferometric modulator changes to the actuated state, the currently applied voltage is used to determine the threshold between the hold voltage and the actuation voltage. Finally, because the device is in the actuated state another actuation voltage may be next determined. A series of voltages of opposite polarities and of successively decreasing magnitude is applied. The state of the device is determined during the time of each of the series of applied voltages by monitoring the current or charge used to apply the voltage. When the interferometric modulator changes to the released state, the currently applied voltage is used to determine the threshold between the hold voltage and the release voltage.

Transition 202 brings the input potential difference to voltage level 203 to initialize the interferometric modulator to an actuated state. The value of voltage level 203 is determined based on theoretical understanding of the interferometric modulator and previous experimentation, and is of sufficient magnitude that actuation of the interferometric modulator is expected. The voltage level 203 is of sufficient duration that the interferometric modulator has time to go into the actuated state.

Transition 204 brings the input potential to voltage level 205. The value of voltage level 205 is determined based on theoretical understanding of the interferometric modulator and previous experimentation, and is of such a magnitude that the interferometric modulator is expected to hold its current state.

From this point, a series of positive and negative transitions of successively decreasing magnitude is applied to the interferometric modulator. Once the interferometric modulator goes to a released state, the release threshold can be determined.

Transition 206 brings the input potential to voltage level 207. Voltage level 207, as indicated in FIG. 9A is above the still unknown release/hold threshold. Accordingly, the interferometric modulator does not release. The current or charge needed to drive the transition 206 is sensed and shown graphically as integrated charge 222. As shown in FIG. 9B, the integrated charge 222 is above the actuated/released charge threshold, indicating that the capacitance of the interferometric modulator is high, revealing that the interferometric modulator is still in the actuated state. Transition 208 brings the input potential to voltage level 209, and the current or charge needed to drive the transition 208 is sensed and shown graphically as integrated charge 224. As shown in FIG. 9B, the integrated charge 224 is below the actuated/released charge threshold, revealing that the interferometric modulator has gone to the released state.

According to the embodiment, voltage level 205 did not release the interferometric modulator, and voltage level 209 did release the interferometric modulator. Accordingly, it is learned that the negative flash release threshold voltage is between voltage level 205 and voltage level 209.

Next, because the device is in the released state, an actuation threshold voltage can be measured. Transition 210 is determined so as to bring the input voltage to voltage level 211. Voltage level 211 has such a value that the device is expected to be held in the same (released) state. From this point, a series of positive and negative transitions of successively increasing magnitude is applied to the interferometric modulator. Once the interferometric modulator goes to an actuation state, the actuation threshold can be determined.

Transition 212 brings the input potential to voltage level 213, and the current or charge needed to drive the transition 212 is sensed and shown graphically as integrated charge 226. As shown in FIG. 9B, the integrated charge 226 is below the actuated/released charge threshold, revealing that the interferometric modulator is still in the released state. Transition 214 brings the input potential to voltage level 215, and the current or charge needed to drive the transition 214 is sensed and shown graphically as integrated charge 228. As shown in FIG. 9B, the integrated charge 228 is above the actuated/released charge threshold, revealing that the interferometric modulator has gone to the actuated state.

According to the embodiment, voltage level 211 did not actuate the interferometric modulator, and voltage level 215 did actuate the interferometric modulator. Accordingly, it is learned that the positive flash actuation threshold voltage is between voltage level 211 and voltage level 215.

Next, because the device is in the actuated state, another release threshold voltage can be measured. Transition 216 is determined so as to bring the input voltage to voltage level 217, where voltage level 211 has such a value that the device is expected to be held in the same (actuated) state. From this point, a series of positive and negative transitions of successively decreasing magnitude is applied to the interferometric modulator. Once the interferometric modulator goes to a released state, the positive flash release threshold can be determined.

Transition 218 brings the input potential to voltage level 219, and the current or charge needed to drive the transition 218 is sensed and shown graphically as integrated charge 230. As shown in FIG. 9B, the integrated charge 230 is below the actuated/released charge threshold, revealing that the interferometric modulator has gone to the released state.

According to the embodiment, voltage level 207 did not release the interferometric modulator, and voltage level 219 did release the interferometric modulator. Accordingly, it is learned that the positive flash release threshold voltage is between voltage level 207 and voltage level 219.

The results of this embodiment allow for calculation of an offset voltage. Ideally positive and negative values for each of the threshold voltages would have the same magnitude. However, due to various factors, there may be an offset. In this embodiment, both the negative and positive flash release threshold voltages are measured. Once both positive and negative values for a threshold voltage are known, an offset voltage can be calculated as the average of the positive and negative threshold values. In other embodiments, other threshold values may be used to calculate offset voltages.

Figure 10A:
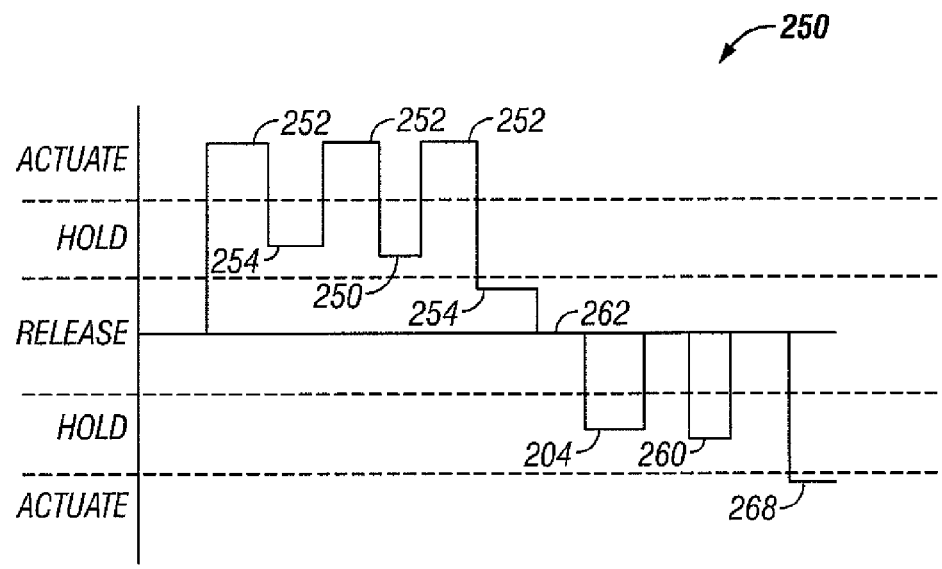
FIGS 10A and 10B are waveforms used for measuring DC thresholds.
Figure 10B:
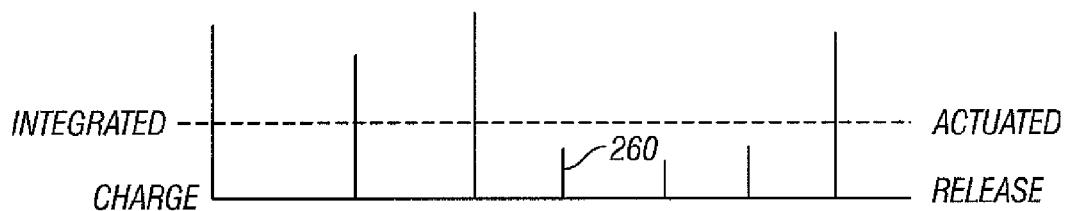

FIG. 10A shows waveform 250 as another test embodiment. Waveform 250 and the integrated charge shown in FIG. 10B are used to measure a positive DC release threshold and a negative DC actuation threshold.

Positive voltage level 252 is used to actuate the interferometric modulator. Thereafter, a series of positive test voltage levels are applied to the device to determine the positive voltage level needed to release the device. After each test voltage level is applied, the positive actuation voltage level 252 is reapplied to the interferometric modulator. The integrated charge, as shown in FIG. 10B is sensed for each transition to determine the state of the interferometric modulator after the test voltages are applied. As shown, voltage levels 254 and 256 are insufficient to cause the interferometric modulator to release. Voltage level 258, however, releases the interferometric modulator, as indicated by integrated charge 260. It is, therefore, learned that the positive DC release voltage is between voltage level 258 and voltage level 256. Additionally, once the interferometric modulator is in the released state, an actuation voltage threshold can conveniently be measured. Voltage level 262 may be applied to initialize the device in the released state. Negative voltage levels of successively increasing magnitude are then applied to the interferometric modulator. As indicated by FIGS. 10A and 10B, voltage levels 264 and 266 are insufficient to actuate the interferometric modulator, and voltage level 268 is sufficient. Accordingly, the negative DC actuation threshold is between voltage levels 266 and 268.

In some embodiments, an input wave form similar to input wave form 120 of FIG. 8C can be used to measure a positive DC release threshold or a negative DC actuation threshold. If the held voltages of the input wave form are steady for a duration significantly longer than that used for normal operation, the procedure described with reference to FIG. 8C can be used to determine DC thresholds.

Figure 11:
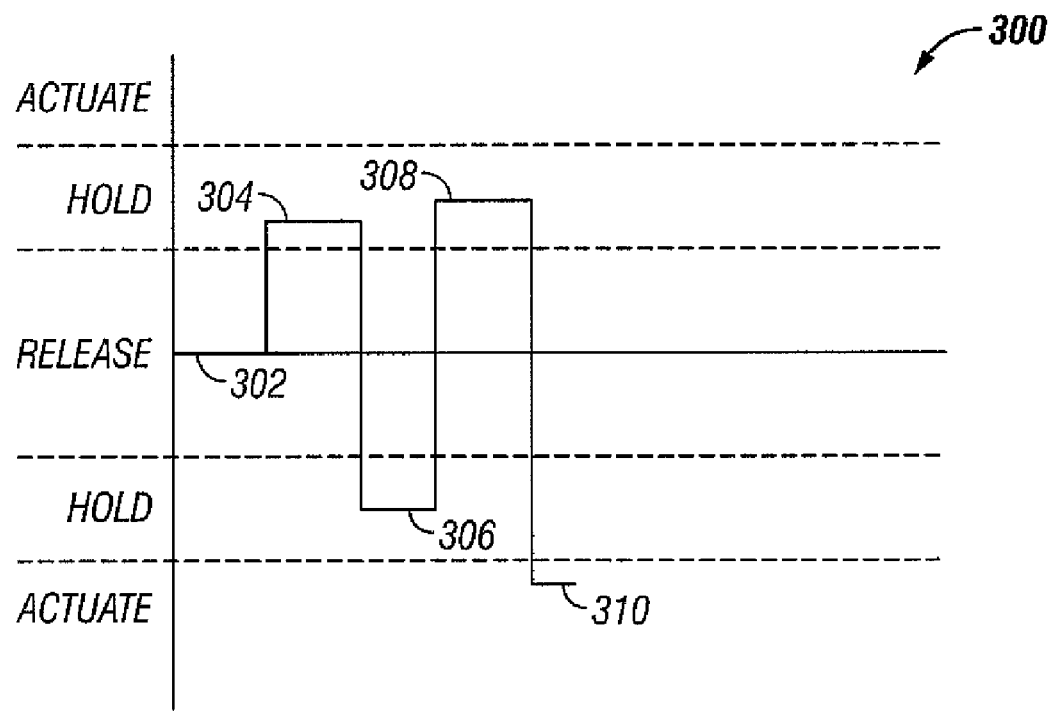
FIG. 11 is a wave form used for measuring a flash actuation threshold.

FIG. 11 shows waveform 300 as another test embodiment. Waveform 300 and the integrated charge sensed during the transitions are used to measure a negative flash actuation threshold.

Voltage level 302 is used to initialize the interferometric modulator in the released state. Starting with voltage level 304, a series of test voltages with successively increasing magnitude are applied to the interferometric modulator. Because voltage levels 304, 306, and 308 are of insufficient magnitude, the interferometric modulator does not actuate. Because applied voltage level 310 is of sufficient magnitude, the interferometric modulator actuates. Because the applied voltage level 310 is the ending voltage of a negative transition from a positive hold voltage, the threshold measured is a negative flash actuation voltage.

Figure 12:
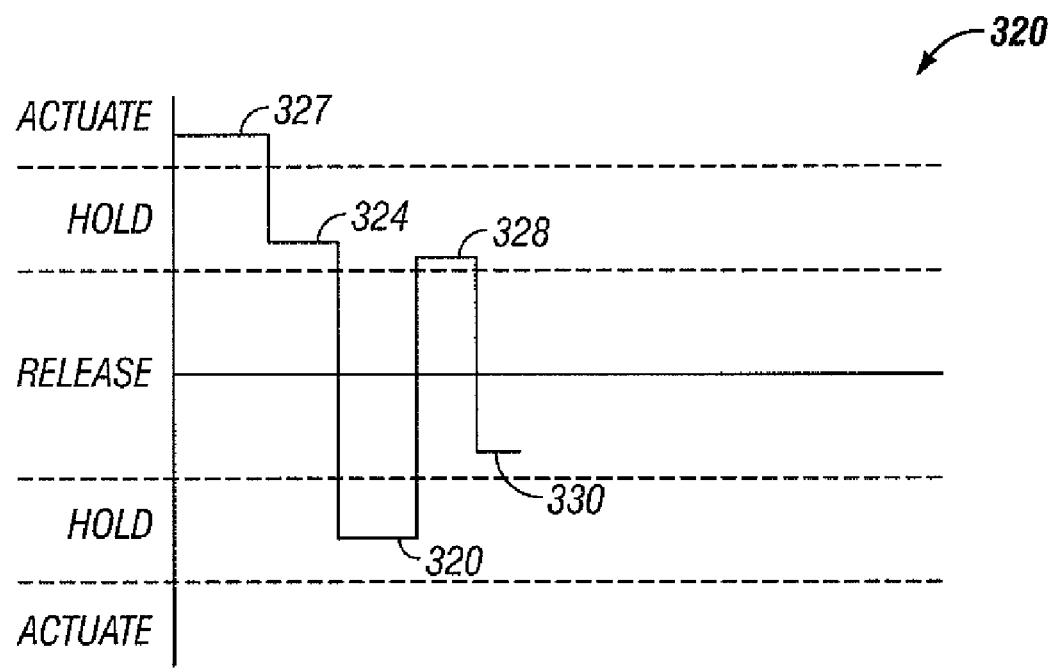
FIG. 12 is a waveform used for measuring a flash release threshold.

FIG. 12 shows waveform 320 as another test embodiment. Waveform 320 and the integrated charge sensed during the transitions are used to measure a negative flash release threshold.

Voltage level 322 is used to initialize the interferometric modulator in the actuated state. Starting with voltage level 304, a series of test voltages with successively decreasing magnitude are applied to the interferometric modulator. Because voltage levels 324, 326, and 328 are of excessive magnitude, the interferometric modulator does not release. Because applied voltage level 330 is of sufficiently small magnitude, the interferometric modulator releases. Because the applied voltage level 330 is the ending voltage of a negative transition from a positive hold voltage, the threshold measured is a negative flash release voltage.

In some embodiments, a test sequence may be used which measures multiple threshold voltages. In such embodiments, the determination as to which threshold voltage is to be measured next may be dynamic. For example, the test embodiment may start by actuating the test device, and measuring the positive DC release voltage using a method such as that described above. Once the device is released during the measurement of the DC release voltage, an actuation voltage may be next determined. In some embodiments, the positive and negative DC actuation and release voltage thresholds may be determined before flash voltage thresholds are determined.

Figure 13:
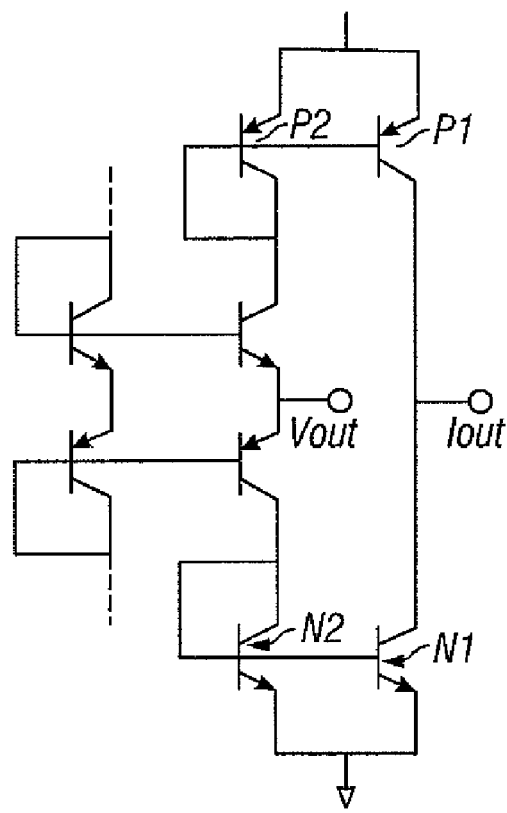
FIG. 13 is a schematic diagram of a circuit used for measuring current.

FIG. 13 shows one example of an output stage which can be used to sense the current used in driving an interferometric modulator. Transistors N1 and P1 mirror the current from the current source transistors N2 and P2 used to drive the Vout signal. Accordingly, the current Iout is substantially equal to the current used for driving the Vout signal. In the test embodiments above the Iout signal may, therefore, be used to determine whether the interferometric modulators are in a high or low capacitive state. Other circuits may also be used.

Figure 14:
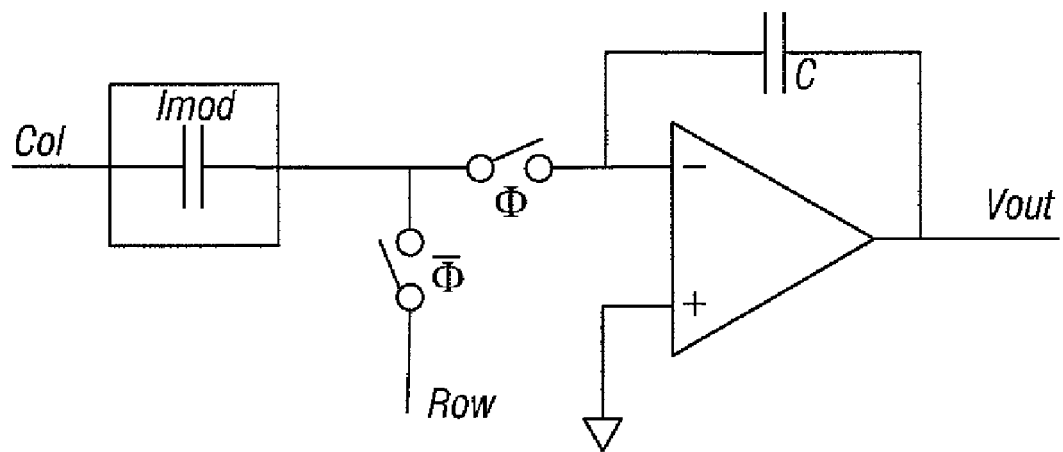
FIG. 14 is a schematic diagram of a circuit used to integrate current or charge during a threshold measurement procedure.

FIG. 14 shows another circuit which can be used. Phi ($\Phi$) and Phi-bar represent two signals that control the respective switches. During one period, the Phi-bar switch is closed, while the Phi switch is open. The current value of the voltage difference between the Col and Row voltages appears on the interferometric modulator. Any changes in the voltage difference results in current flow through the interferometric modulator. However, this will not affect the output voltage Vout because the Phi switch disconnects the two, and the interferometric modulator current passes to ground via the switch Phi-bar. This arrangement of the switches may be used to initialize the interferometric modulator.

In the opposite arrangement, the Phi-bar switch is open and the Phi switch is closed. Any changes in the voltage difference again result in current through the interferometric modulator, but this current goes via the capacitor C. In this case, the integrator circuit output Vout is proportional to the charge transfer through the interferometric modulator. Accordingly the circuit of FIG. 14 can be used to sense the current or charge used to drive the interferometric modulator to determine its state. In some embodiments, the Col and Row voltages may be signals other than column and row voltages. For example, one of the Col and Row voltages may be grounded. In some embodiments, the integrator has a reset circuit configured to reset the integrator output voltage Vout when desired.

Figure 15:
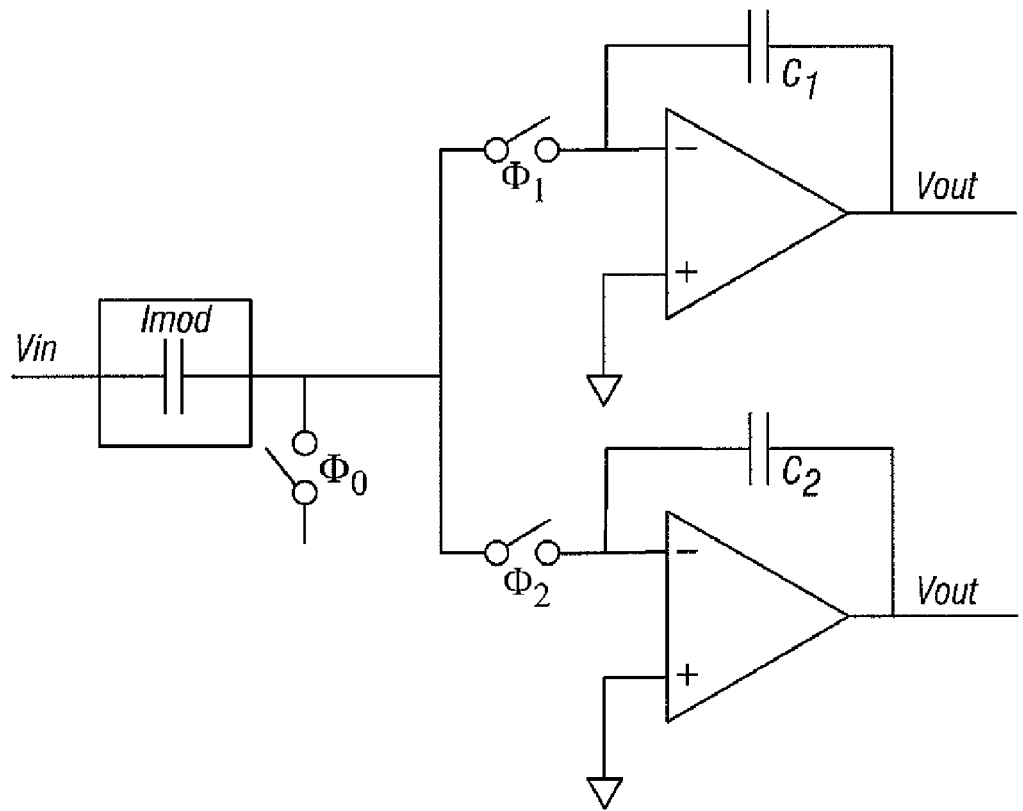
FIG. 15 is a schematic diagram of a circuit using two integrator circuits to integrate current or charge during a threshold measurement procedure.

In some embodiments, it is desirable to sense current or charge for positive transitions using different circuitry than that used to sense current or charge for negative transitions. This may be useful, for example, so that the result of one transition may be analyzed while a next transition is being driven onto the interferometric modulator. FIG. 15 shows such an arrangement. Switch $Phi_0$ is closed to initialize the interferometric modulator, switch $Phi_1$ is closed for positive transitions, and switch $Phi_2$ is closed for negative transitions. With this circuit, a next transition can be applied to the interferometric modulator without waiting for the integrated charge of the previous transition to be tested to determine whether the interferometric modulator changed state. In some embodiments, the integrators each have a reset circuit configured to reset the integrator output voltages Vout when desired.

Figure 16:
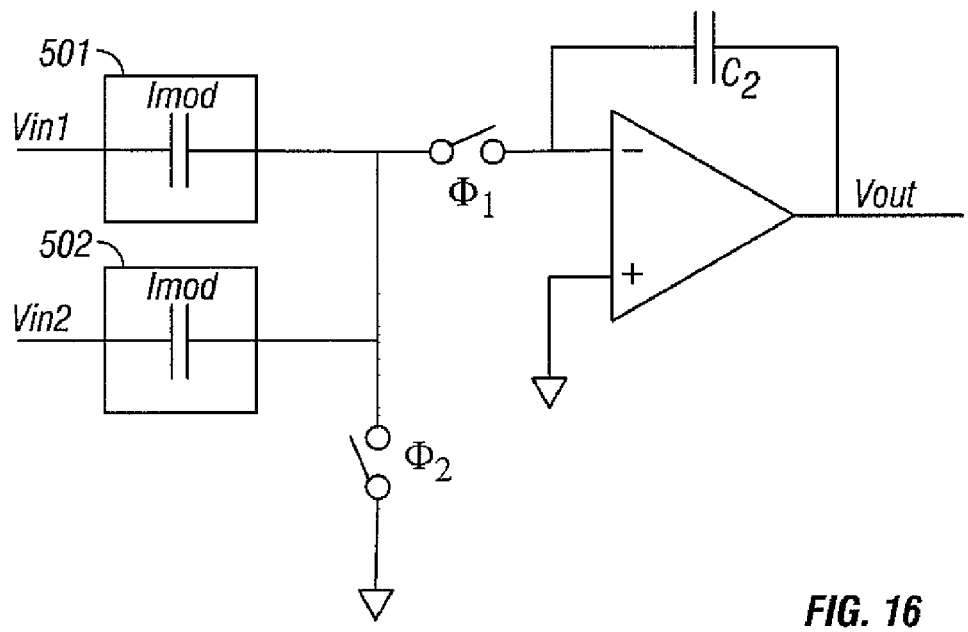
FIG. 16 is a schematic diagram of a circuit used for a threshold measurement procedure using multiple MEMS devices.

FIG. 16 shows a schematic of current or charge sensing circuit 500. Circuit 500 can be used to measure crosstalk thresholds with methods similar to those used do measure the other threshold voltages discussed above. As discussed above, a crosstalk threshold is measured by determining whether the test interferometric modulator undesirably changes state as a result of a driving voltage applied to another interferometric modulator. In some embodiments, the integrator has a reset circuit configured to reset the integrator output voltage Vout when desired.

To initialize the state of test interferometric modulator 501 and of the other interferometric modulator 502, switch $Phi_2$ is closed and switch $Phi_1$ is opened. Vin1 and Vin2 are then used to initialize the states of the interferometric modulators 501 and 502. The interferometric modulators 501 and 502 can be initialized into either the actuated or released state, and may be initialized to the same state or to different states. If the crosstalk threshold to be determined is a crosstalk release threshold, the test interferometric modulator 501 is initialized to an actuated state. Similarly, if the crosstalk threshold to be determined is a crosstalk actuation threshold, the test interferometric modulator 501 is initialized to a released state.

Once initialized, the test interferometric modulator 501 is held with a test voltage on Vin1. If the crosstalk threshold to be determined is a positive crosstalk threshold, the test interferometric modulator 501 is held with a positive test voltage. Similarly, if the crosstalk threshold to be determined is a negative crosstalk threshold, the test interferometric modulator 501 is held with a negative test voltage.

Once the test voltage is applied to the test interferometric modulator 501, switch $Phi_2$ is opened and switch $Phi_1$ is closed to connect the integrator 505 to the interferometric modulators 501 and 502. Vin2 is changed so as to change the state of interferometric modulator 502. For example, if interferometric modulator 502 is initialized to a released state, Vin2 may be changed from a release input voltage to a positive actuation voltage. The change at Vin2 might cause the test interferometric modulator 501 to change states. This will occur if the shared impedances are appropriate and the test voltage applied to the test interferometric modulator 501 is insufficient to hold the test interferometric modulator 501 in its initialized state.

The output Vout of the integrator will indicate whether the test interferometric modulator 501 has changed states. The change in voltage at Vin2 causes an amount of charge to be injected onto the common node N1. Through theoretical understanding and through experimentation, the quantity of charge injected is known. If the test interferometric modulator 501 does not change states, the output Vout will change in a known way so as to absorb the injected charge. For example, if Vin2 changes from a negative hold voltage to a positive actuation voltage, the charge injected onto common node N1 causes the integrator to lower the output Vout by a known amount to remove the charge from the common node N1. If, however, the test interferometric modulator 501 changes states, the test interferometric modulator 501 will either absorb some of the injected charge or inject additional charge. Accordingly, if the test interferometric modulator 501 changes states, the output Vout will be different from the value expected from the charge injected from interferometric modulator 502 alone. When interferometric modulator 501 changes states, charge is either injected to or absorbed from common node N1 by interferometric modulator 501 according to whether the test interferometric modulator 501 actuates or releases and whether the test voltage at Vin1 is positive or negative. For example, if the test interferometric modulator 501 is held in an actuated state with a positive test voltage, and the change at Vin2 causes the test interferometric modulator 501 to change to a released state, additional charge will be injected onto common node N1. The integrator will integrate the additional charge along with the charge injected from the other interferometric modulator 502, with a result that the output Vout of the integrator will be lower than if the integrator integrated charge from the other interferometric modulator 502 alone. Knowing that the test interferometric modulator 501 was being held in the actuated state with the positive test voltage, it is learned that the positive test voltage is insufficient to hold the test interferometric modulator 501 in the actuated state when the other interferometric modulator 502 is driven.

Accordingly, to measure the positive crosstalk actuation threshold, a series of positive test voltages are applied to the test interferometric modulator 501, and a driving voltage is applied to the other interferometric modulator 502 after each test voltage of the series. The output Vout of the integrator 505 is monitored to determine whether or not the test interferometric modulator 501 changes states after each driving voltage is applied. The positive crosstalk actuation threshold is the minimum test voltage applied to the test interferometric modulator 501 resulting in the test interferometric modulator 501 not releasing when the other interferometric modulator 502 changes states to either an actuated or a released state.

Using analogous methods, other crosstalk thresholds can be measured. For example, the positive crosstalk release threshold is the maximum test voltage applied to the test interferometric modulator 501 resulting in the test interferometric modulator 501 not actuating when the other interferometric modulator changes states to either an actuated or a released state.

The methods discussed with reference to FIG. 16 can be applied to individual interferometric modulators of an array. For example, the test interferometric modulator 501 may be in a first column of the array and the other interferometric modulator 502 may be in a second column of the array. In some embodiments, the test interferometric modulator 501 and the other interferometric modulator 502 are in adjacent columns in the same row of the array.

In some embodiments, other threshold voltages are measured prior to measuring a crosstalk threshold. For example, in some embodiments, at least one DC threshold is measured before a flash threshold, and a crosstalk threshold is measured after the flash threshold. In some embodiments, the DC threshold is used to determine a starting or an ending voltage for a transition used to measure the flash threshold. In some embodiments, the flash threshold is used to determine a starting or an ending voltage for a transition used to measure the crosstalk threshold.

In some embodiments, the methods are applied to interferometric modulators which are separated from the array. In addition to the array, two or more additional interferometric modulators may be fabricated along with the integrator circuitry. In such embodiments, the additional interferometric modulators and the integrator circuitry may at least partly form characterization circuitry which can be used to determine threshold values for the array.

In some embodiments, the thresholds measured will be applied universally to all of the elements of the display array, measurements may be performed over a large group of elements. For example, a section of the array, such as a row or column, or group of rows or columns may be tested simultaneously, and a threshold determined based on the collective performance of the group. Criteria for the thresholds may be arbitrarily set. For example, a release threshold may be set such that the threshold is the voltage where all of the elements of the group release. Similarly, a release threshold may be set such that at least a certain minimum number of the group release.

In addition, multiple tests may be performed on the same interferometric modulator or on the same group of interferometric modulators. The information collected from the tests may be used to determine thresholds based on an algorithm. For example, the threshold may be defined as the value sufficient to cause a desired behavior at least 90% of the time.

In some embodiments, the integrator or integrators are not reset after each measurement. In such embodiments, a threshold voltage can be measured by integrating the current or charge while performing the following steps: 1) initialize a test interferometric modulator to a desired state by applying a voltage transition starting from a hold voltage, 2) apply a test voltage to the test interferometric modulator, and 3) reapply the hold voltage. If the interferometric modulator did not change states as a result of the test voltage, the integrated current or charge will be near zero. However, if the interferometric modulator changes states, the integrated charge will not be zero.

The circuit of FIG. 16 can be used to measure the response of a group of interferometric modulators. In some embodiments, half of the tested interferometric modulators are driven with a positive transition, and the other half are driven with a negative transition. If all of the interferometric modulators start and remain in the same state, the integrated current or charge should be near zero.

Figure 18:
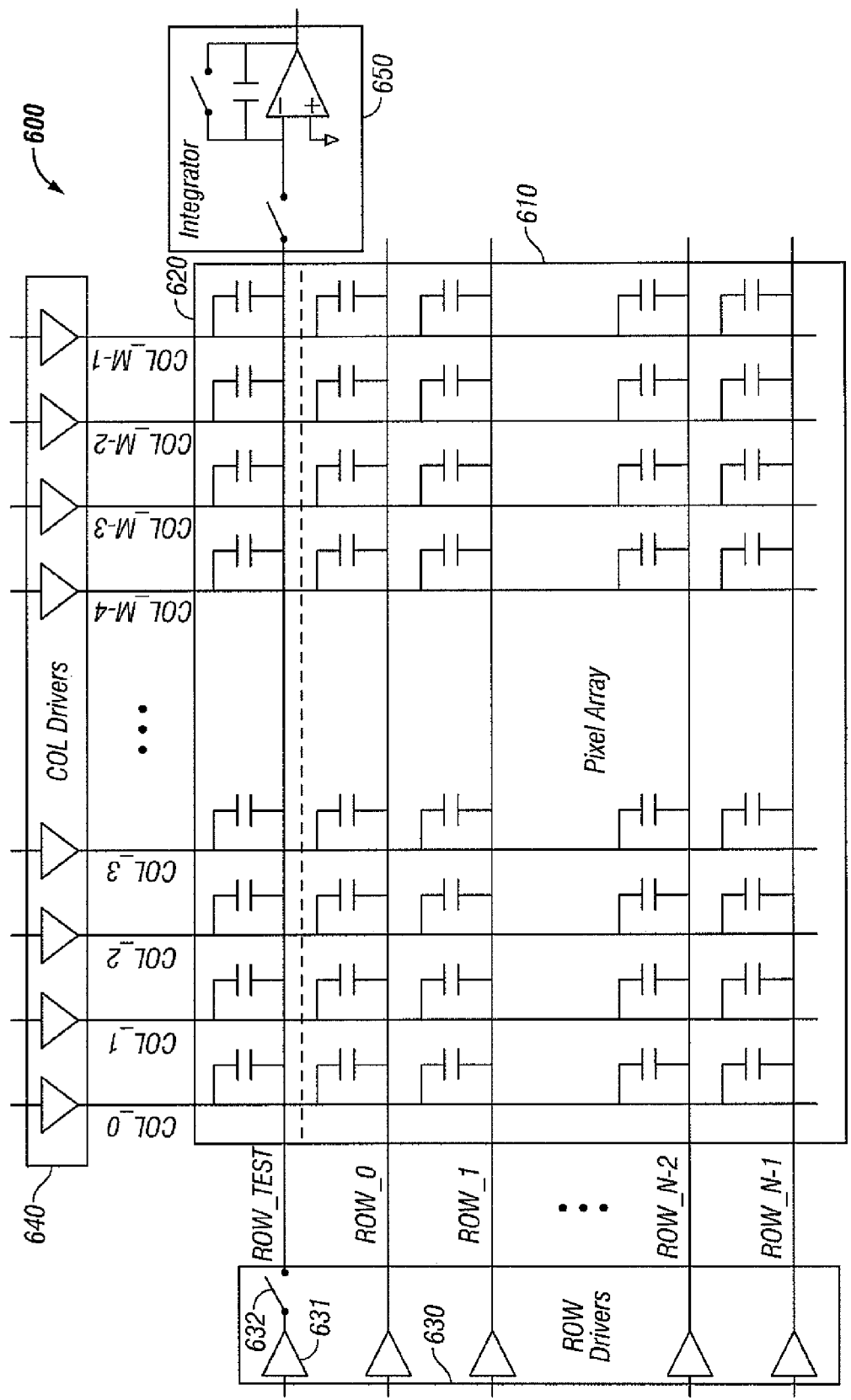
FIG. 18 is a schematic diagram of a display having test circuitry.

FIG. 18 is a schematic diagram of a display 600 having test circuitry. The display includes a pixel array 610, where each pixel is represented by a capacitor. The display also includes a test row 620, row drivers 630, column drivers 640, and an integrator 650.

In this embodiment, the test row 620 is formed of pixels at the driven end of the columns. In some embodiments, the test row 620 is at various other locations, such as in a central portion of the array, or at the opposite end of the columns from the column drivers 640. In some embodiments, there are multiple test rows.

In some embodiments, the test row 620 is not part of the array 610 which displays an image to the user. However, in other embodiments, with appropriate timing of the test signals, the test row 620 is part of the image area with little or no visible artifacts arising from the calibration.

The row and column drivers 630 and 640 are configured to drive the rows and columns to display images during normal operation, and to drive the rows and columns with calibration patterns when calibration occurs. One end of the test row 620 is driven from a standard row driver in the same manner as the image area rows. During non-calibration periods, a suitable row signal may be applied to ensure that, over time, the test pixels see a set of drive voltages that are similar to the pixels in the image area. For example, the test row signal might simply match a row in the middle of the display. During calibration, the test row is driven with a test signal or connected to a reference voltage (e.g. ground).

Once the test row is prepared for the calibration measurement, it is isolated from the driver. A switch 632 for the row driver 631 of the test row 620 is configured to achieve this. In some embodiments, the row drivers themselves are configured to disconnect from the row which they drive. For example, the row drivers may each comprise three pass transistors connecting the row line to one of three drive voltages. The isolated state can simply be achieved by turning off all three pass transistors and no additional switch is required.

When isolated from the row driver, the test row is connected to the input of an integrator 650 that acts as a virtual ground. In the embodiment shown, the integrator 650 is connected to the end of the test row 620 opposite the test row driver 631. In other embodiments, the integrator 650 may be connected to the test row 620 at other locations (e.g. the same end as the test row driver 631).

Figure 19:
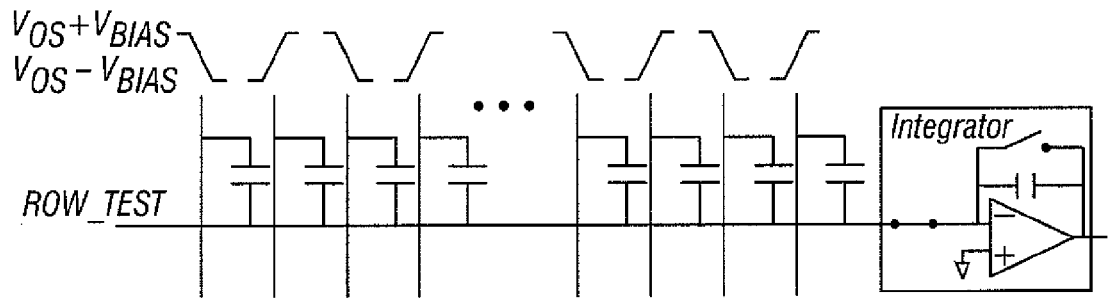
FIG. 19 is a schematic diagram showing a test measurement.

In some embodiments, methods of determining threshold voltages use a differential capacitance measurement to determine the state of the pixels along the test row. The measurement, illustrated in FIG. 19, occurs with the test row 620 held at a hold reference voltage by the integrator 650. With the test row 620 at the hold reference voltage, alternate columns are held at the positive and negative bias voltages, respectively. To determine the state of the pixels, the polarity of all columns is switched. If $C_{pix\_i}$ is the capacitance of the $i^{th}$ pixel along the test row, the total charge injected onto the test row when the segments switch is:

$$Q = \sum_{i=0,2,4...} (2 \cdot V_{BIAS} \cdot C_{pix\_i}) - \sum_{i=1,3,5...} (2 \cdot V_{BIAS} \cdot C_{pix\_i}) \quad (1)$$

If all the pixels are in the same state and have the same capacitance ($C_{pix\_i}=C_{pix}$), the total charge injected into the test row and measured by the integrator is zero:

$$Q = M \cdot V_{BIAS} \cdot C_{pix} - M \cdot V_{BIAS} \cdot C_{pix} = 0 \quad (2)$$

If one or more pixels is in a different state during the measurement, the two terms in equation (1) do not cancel and a net charge is measured by the integrator 650. For example, suppose that all the pixels but one in the test row are in the released state and have a capacitance of $C_{pix\_rel}$, and that the one actuated pixel has a capacitance of $C_{pix\_act}$ and is connected to a positive going segment. The total charge collected at the integrator is then:

$$Q = \left(\frac{M}{2} - 1\right) \cdot 2 \cdot V_{BIAS} \cdot C_{pix\_rel} + 2 \cdot V_{BIAS} \cdot C_{pix\_act} - \quad (3)$$
$$M \cdot V_{BIAS} \cdot C_{pix\_rel}$$
$$= 2 \cdot V_{BIAS} \cdot (C_{pix\_act} - C_{pix\_rel})$$

For example, if the actuated pixel is connected to a negative going segment, the measured charge is negative. For a bi-chrome display with a 222 μm square pixel, $C_{pix\_act} \approx 12$ pF and $C_{pix\_rel} \approx 3$ pF, the integrated charge arising from a single pixel in the actuated state is ~100 pC (assuming $V_{BIAS} \approx 5.5$ v), which is detectable. If more pixels are actuated, then the measurement charge increases linearly.

The integrator 650 measures the difference between the total pixel capacitance connected to the positive going segments and the total pixel capacitance connected to the negative going segments. The output signal from the integrator 650 is thus proportional to the difference in the number of actuated pixels connected to the positive going segments and the number connected to the negative going segments. This proportionality is used in the calibration methods.

Figure 20:
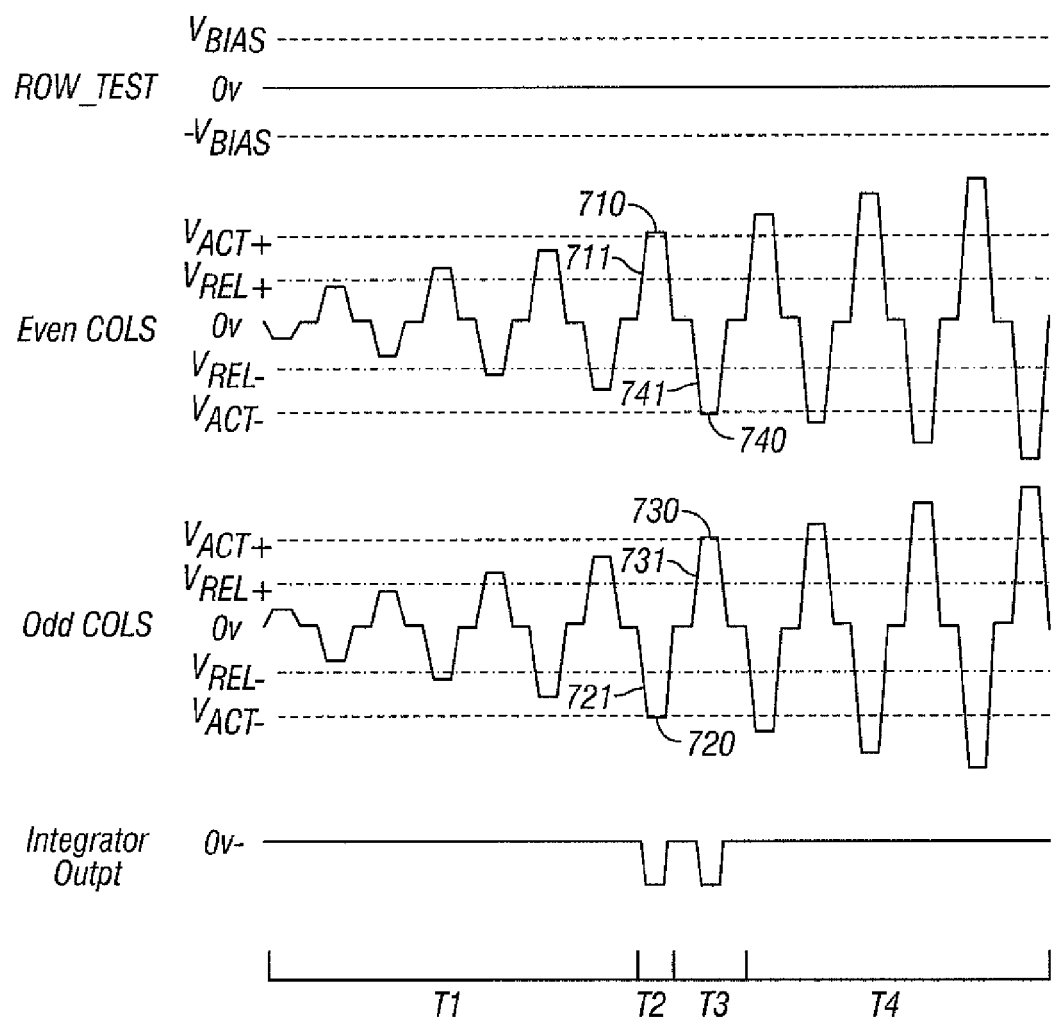
FIG. 20 is a timing diagram illustrating a method which can be used to establish actuation voltages.

FIG. 20 illustrates a calibration method which can be used to establish actuation voltages. The method can be used, for example, at start-up, and/or intermittently during operation. In this embodiment, positive and negative actuation voltages are determined.

FIG. 20 shows the calibration test signals applied to the test row 620 and to the columns of the display. The test row 620 receives a test reference voltage throughout the test. In this embodiment, the reference voltage is 0v. The even and odd columns receive test signals of opposite polarities. In other embodiments, the columns may be divided into separate groups in other ways. For example, columns on the left side of the display may receive test signals of opposite polarity from those columns on the right side of the display. In some embodiments, the number of pixels in one group is different than the number in the second group. In some embodiments, there are one or more pixels in neither group.

In this embodiment, the even and odd pixels receive test signals of increasing magnitude, with release signals between the test signals. As discussed above, while the magnitude of the difference between the row voltage and the column voltage is below the release threshold of the pixels, the pixels will be in the released state. Once the magnitude of the test signals is greater than the actuation threshold, the pixels will actuate. Because release signals are driven between each of the test signals, the pixels are released after each test signal.

FIG. 20 also shows the output of the integrator 650, which determines whether or not the pixels are in different states by integrating the charge injected onto the test row during each of the test signals.

During time period T1, the column test signals are less than the actuation threshold of the pixels. Accordingly, during T1, the pixels remain in the released state. As a result, the integrated charge at the integrator 650 is substantially 0, and the output of the integrator 650 remains at 0 v.

During time period T2, the pixels of the even and the odd columns are driven with test edges 711 and 721 while the integrator 650 integrates the charge injected onto the test row by the test edges 711 and 721. Because the level 710 of the even column test signal is greater than the positive actuation threshold Vact+, the pixels of the even columns actuate. The level 720 of the odd columns, however, is greater than the negative actuation threshold Vact−, and the pixels of the odd columns remain released. Because the even columns are actuated and the odd columns are released, the charge injected from the lower capacitance of the released pixels of the odd columns is insufficient to cancel the charge injected due to the actuated pixels of higher capacitance of the even columns. As a result, the output of the integrator 650 shows the imbalance. The polarity of the imbalance indicates that the even columns actuated during the application of the positive test edge 711. Accordingly, the positive actuation threshold Vact+ can be determined based on the level 720 of the positive test signal.

Similarly, during time period T2, the pixels of the even and the odd columns are driven with test edges 731 and 741 while the integrator 650 integrates the charge injected onto the test row by the test edges 731 and 741. Because the level 730 of the odd column test signal is greater than the positive actuation threshold Vact+, the pixels of the odd columns actuate. The level 740 of the even columns, however, is greater than the negative actuation threshold Vact−, and the pixels of the even columns remain released. Because the even columns are released and the odd columns are actuated, the charge injected from the lower capacitance of the released pixels of the even columns is insufficient to cancel the charge injected due to the actuated pixels of higher capacitance of the odd columns. As a result, the output of the integrator 650 shows the imbalance. The polarity of the imbalance indicates that the odd columns actuated during the application of the positive test edge 731. Accordingly, the positive actuation threshold Vact+ can be determined based on the level 740 of the positive test signal.

During time period T4, the level of the positive test signals for both the even and odd columns is greater than the positive actuation threshold Vact+. Also, the level of the negative test signals for both the even and odd columns is less than the negative actuation threshold Vact−. Accordingly, the pixels of the both the even and odd columns actuate in response to each of the test signals.

As above, the integrator 650 integrates the charge injected onto the test row by the test signals. Because both the even and odd columns are actuated by the test signals, the charge injected from the higher capacitance of the even columns substantially cancels the charge injected due to the release of the higher capacitance of the actuated odd columns. As a result, the output of the integrator 650 shows no imbalance. The first occurrence of no imbalance indicates a maximum negative actuation voltage Vact−. Accordingly, the negative actuation threshold Vact− can be determined based on the level of the negative test signal at the first occurrence of no imbalance.

In some embodiments, the above sequence is repeated with reversed polarities. This may be used to determine differences in even and odd pixels.

The sequence described above will detect the first pixel to actuate on the positive side (if the offset is negative) or on the negative side (positive offset). If not all of the positive side pixels actuate, detecting the first pixel to actuate in the other polarity may be less straightforward. The charge injection will only be fully balanced once all the pixels actuate in both polarities. This difficulty can be overcome by ensuring that the integrator has sufficient dynamic range to encompass the minimum (single pixel) and maximum (M/2 pixels) difference between the two groups. The onset of actuation on the negative side (assuming a negative offset) will then be detected as the first reduction in integrator output.

This method has the potential to fail if the pixels happen to have a zero offset. Actuations on the positive and negative side will cancel out. To address this, in some embodiments, if the actuation voltages are not found, the test sequence is repeated with an initial offset other than 0v to eliminate the symmetry. Also to address this, in some embodiments, the positive and negative drive voltage levels are incremented separately. This introduces an asymmetry into the injected charge even if the pixel capacitances are all the same (the voltage swings for the odd and even segments will not be equal when the positive and negative voltages are not equal), but this offset can be accounted for in the measurement interpretation.

The test sequence of FIG. 20 shows a simple linear ramp in test voltage. Other test algorithms may be used. For example, because the pixels are released between each test, a binary search can be used.

With two test pulses at each amplitude, a voltage step of 50 mV and a full test range of (7.5V−1.75V=5.75V), a single pulse test time (with actuation and release phases and integrator settling) of 1 ms, and an 8-step binary search (5.75/0.05~$2^7$), the test time for this sequence can be estimated as ~2*8*1 ms=16 ms.

Figure 21:
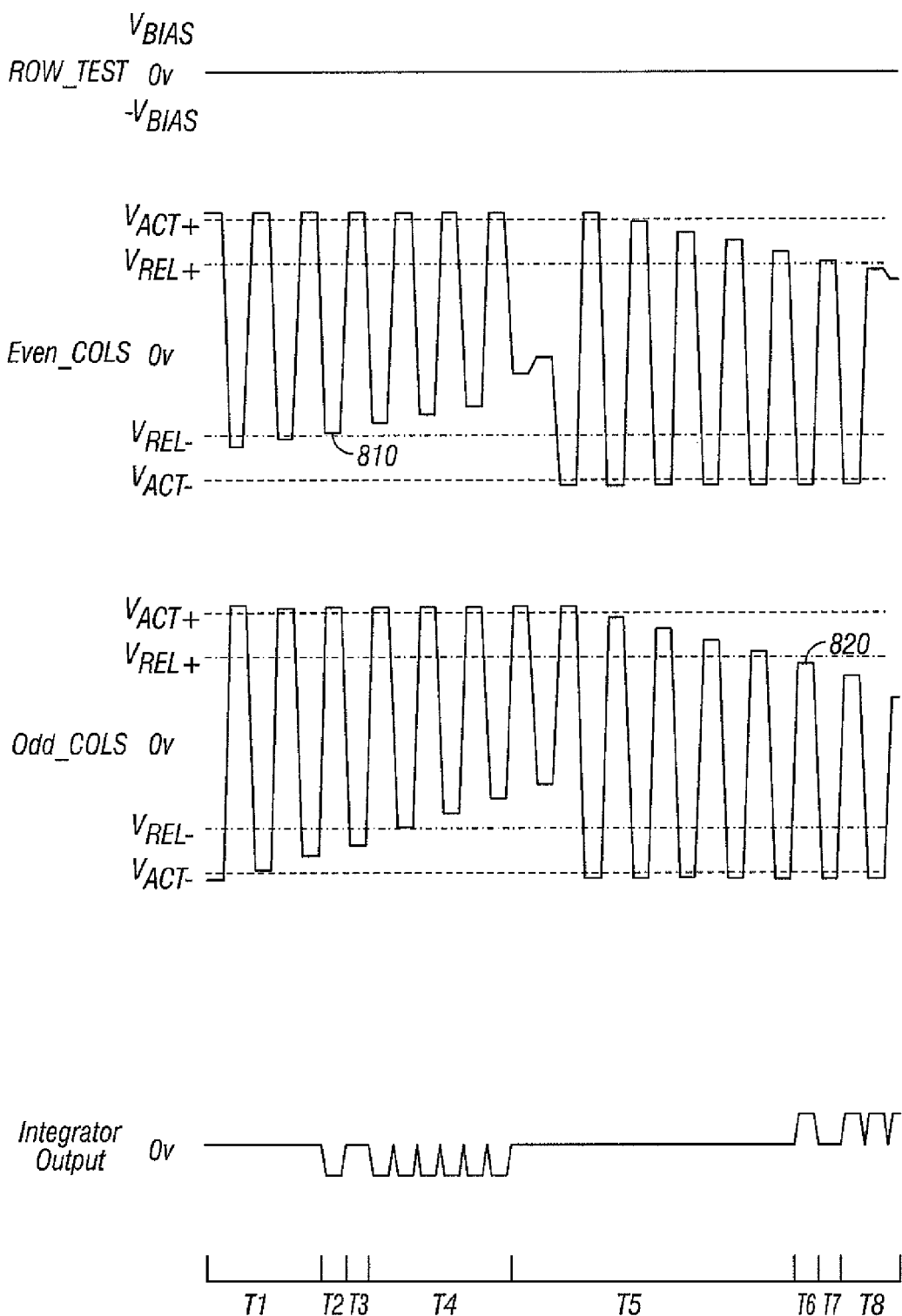
FIG. 21 is a timing diagram illustrating a method which can be used to establish release voltages.

FIG. 21 illustrates a calibration method which can be used to establish release voltages. The method can be used, for example, at start-up, and/or intermittently during operation. In this embodiment, positive and negative release voltages are determined.

FIG. 21 shows the calibration test signals applied to the test row 620 and to the columns of the display. The test row 620 receives a test reference voltage throughout the test. In this embodiment, the reference voltage is 0v. The even and odd columns receive test signals of opposite polarities, which alternate between an actuation voltage and a potential release voltage. In other embodiments, the columns may be divided into separate groups in other ways. For example, columns on the left side of the display may receive test signals of opposite polarity from those columns on the right side of the display. In some embodiments, the number of pixels in one group is different than the number in the second group. In some embodiments, there are one or more pixels in neither group.

In this embodiment, the even and odd pixels receive test signals which alternate between actuation and potential release voltages, where the potential release voltages are of decreasing magnitude. As discussed above, while the magnitude of the difference between the row voltage and the column voltage is greater than the actuation threshold of the pixels, the pixels will be in the actuated state. Once the magnitude of the test signals is less than the release threshold, the pixels will release. Because actuation signals are driven between each of the potential release signals, the pixels are actuated after each potential release signal. Also, because the even and odd column signals are of opposite polarity, while a potential release signal is applied to either of the even and odd columns, the actuation signal is applied to the other of the even and odd columns.

FIG. 21 also shows the output of the integrator 650, which determines whether or not the pixels are in different states by integrating the charge injected onto the test row during each of the potential release signals.

During time period T1, the potential release signals are less than the negative release threshold Vrel− of the pixels. Accordingly, during T1, the pixels remain in the actuated state. As a result, the integrated charge at the integrator 650 is substantially 0, and the output of the integrator 650 remains at 0v.

During time period T2, the level 810 of the even column test signal is greater than the negative release threshold Vrel−. Accordingly, the pixels of the even columns release. The odd columns, however, remain actuated because of the actuation voltage applied thereto. Because the even columns are released and the odd columns are actuated, the charge injected from the lower capacitance of the released pixels of the even columns is insufficient to cancel the charge injected by the higher capacitance of the actuated odd columns. As a result, the output of the integrator 650 shows the imbalance. Accordingly, the negative release threshold Vrel− can be determined based on the level 810 of the test signal.

During time period T3, the potential release signals are less than the negative release threshold Vrel− of the pixels. Accordingly, during T3, the pixels remain in the actuated state. As a result, the integrated charge at the integrator 650 is substantially 0, and the output of the integrator 650 remains at 0v.

During time period T4, the levels of the potential release voltages of both the even and odd columns is greater than the negative release threshold Vrel−. Accordingly, the pixels of the even and odd columns release. While either the even or odd columns release in response to the potential release test voltage applied thereto, the other of the even and odd columns receives an actuation voltage. Accordingly, because either the even or odd columns are released and the other of the even and odd columns are actuated, the charge injected from the lower capacitance of the released pixels is insufficient to cancel the charge injected by the higher capacitance of the actuated pixels. As a result, the output of the integrator 650 shows the imbalance.

During time periods T5-T8, the even and odd pixels receive test signals which alternate between actuation and potential release voltages, where the potential release voltages are positive and of decreasing magnitude.

During time period T5, the potential release signals are greater than the positive release threshold Vrel+ of the pixels. Accordingly, during T5, the pixels remain in the actuated state. As a result, the integrated charge at the integrator 650 is substantially 0, and the output of the integrator 650 remains at 0 v.

During time period T6, the level 820 of the odd column test signal is less than the positive release threshold Vrel+. Accordingly, the pixels of the odd columns release. The even columns, however, remain actuated because of the actuation voltage applied thereto. Because the odd columns are released and the even columns are actuated, the charge injected from the lower capacitance of the released pixels of the odd columns is insufficient to cancel the charge injected by the higher capacitance of the actuated even columns. As a result, the output of the integrator 650 shows the imbalance. Accordingly, the positive release threshold Vrel+ can be determined based on the level 820 of the test signal.

During time period T7, the potential release signals of both the odd and even columns are greater than the positive release threshold Vrel+ of the pixels. Accordingly, during T7, the pixels remain in the actuated state. As a result, the integrated charge at the integrator 650 is substantially 0, and the output of the integrator 650 remains at 0v.

During time period T8, the levels of the potential release voltages of both the even and odd columns is less than the positive release threshold Vrel+. Accordingly, the pixels of the even and odd columns release. While either the even or odd columns release in response to the potential release test voltage applied thereto, the other of the even and odd columns receives an actuation voltage. Accordingly, because either the even or odd columns are released and the other of the even and odd columns are actuated, the charge injected from the lower capacitance of the released pixels is insufficient to cancel the charge injected by the higher capacitance of the actuated pixels. As a result, the output of the integrator 650 shows the imbalance.

The embodiment of FIG. 21 shows a simple linear search, however, other search algorithms can be used. For example a binary search can be used. In some embodiments, measurements on the positive and negative side can be interlaced in time to maintain better overall drive balance to minimize any pixel charging during the measurement.

Using approximations similar to those discussed above with regard to FIG. 20, the test time for the embodiment of FIG. 21 is estimated as about 16 ms for each polarity, 32 ms total.

Figure 22:
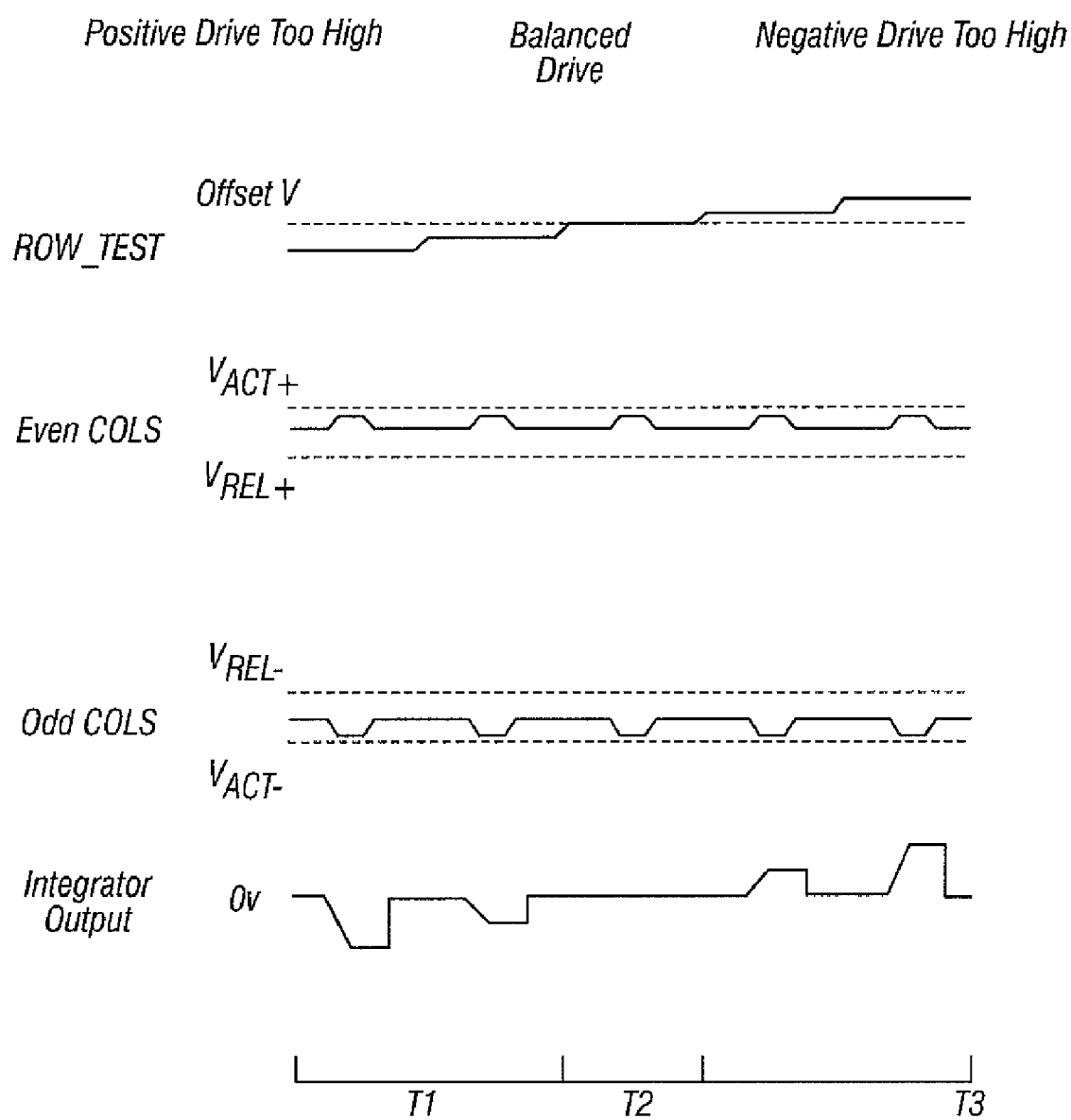
FIG. 22 is a timing diagram illustrating a method which can be used to adjust an offset voltage.

FIG. 22 illustrates a calibration method which can be used to adjust an offset voltage. The actuation and release behavior of the pixels are not necessarily symmetric about 0v. Using a voltage (offset voltage) about which the pixel behavior is symmetric allows for improved operation of the device. The method can be used, for example, at start-up, and/or intermittently during operation. This embodiment includes a method which determines the offset voltage which balances the capacitance between pixels in positive and negative release states.

FIG. 22 shows the test signals applied to the test row 620 and to the columns of the display. The test row 620 receives a series of potential offset voltages, which are each tested to determine the equality of the capacitances of the pixels in positive and negative release states. The even and odd columns receive test signals of opposite polarities. In other embodiments, the columns may be divided into separate groups in other ways. For example, columns on the left side of the display may receive test signals of opposite polarity from those columns on the right side of the display. In some embodiments, the number of pixels in one group is different than the number in the second group. In some embodiments, there are one or more pixels in neither group.

After being initialized to a released state, for each potential offset voltage applied to the test row 620, equal and opposite pulses are applied to the even and odd columns, which are biased with equal and opposite bias voltages. In this embodiment, the even columns are in a positive release state, and the odd columns are in a negative release state. As shown, the polarity of the pulses in this embodiment increase the voltage difference between the column and row electrodes. Other arrangements of positive and negative release states and pulse polarity can be used.

While the test row 620 is held at a potential offset voltage, the test pulses are applied to the even and odd columns, and the integrator 650 integrates the charge injected by the even and odd columns onto the test row 620. If the potential offset voltage is not equal to the unknown offset voltage to be determined, the pixels in the positive release state (even columns) and the pixels in the negative release state (odd columns) will have different capacitances. As discussed above, because of the different capacitances, the charge injected from each of the even and odd columns as a result of the equal and opposite pulses will have different magnitudes. Accordingly, the injected charge from the even columns will not cancel the charge injected from the odd columns, and the integrator 650 will output a signal based on the difference.

As shown in FIG. 22, during time period T1, the potential offset voltage applied to the test row 620 is less than the unknown offset voltage to be determined. As a result, the effective voltage difference between the test row and the even columns is greater than the effective voltage difference between the test row and the odd columns. This causes the capacitance of the even columns to be greater than the capacitance of the odd columns. This occurs because the distance (and therefore capacitance) between the flexible membranes and the optical stacks of the pixels is related to the effective voltage difference between the test row voltage and the column voltages.

As discussed above, the higher capacitance of the even columns injects more charge onto the test row 620 than the lower capacitance of the odd columns. As shown, during time period T1, the integrator output shows that the injected charge is imbalanced. The polarity of the integrator output indicates that the columns having received the positive test pulse (even columns) injected more charge than the columns having received the negative test pulse (odd columns). This indicates that the potential offset voltage applied to the test row 620 is lower than the unknown offset voltage to be determined.

Similarly, during time period T3, the potential offset voltage applied to the test row 620 is greater than the unknown offset voltage to be determined. As a result, the effective voltage difference between the test row and the even columns is less than the effective voltage difference between the test row and the odd columns. This causes the capacitance of the even columns to be less than the capacitance of the odd columns. This occurs because the distance (and therefore capacitance) between the flexible membranes and the optical stacks of the pixels is related to the effective voltage difference between the test row voltage and the column voltages.

Accordingly, the higher capacitance of the odd columns injects more charge onto the test row 620 than the lower capacitance of the even columns. As shown, during time period T3, the integrator output indicates that the injected charge is imbalanced. The polarity of the integrator output shows that the columns having received the positive test pulse (even columns) injected less charge than the columns having received the negative test pulse (odd columns). This indicates that the potential offset voltage applied to the test row 620 is higher than the unknown offset voltage to be determined.

In contrast, during time period T2, the potential offset voltage applied to the test row 620 is equal to the unknown offset voltage to be determined. As a result, the effective voltage difference between the test row and the even columns is equal to the effective voltage difference between the test row and the odd columns. This causes the capacitance of the even columns to be equal to the capacitance of the odd columns. This occurs because the distance (and therefore capacitance) between the flexible membranes and the optical stacks of the pixels is related to the effective voltage difference between the test row voltage and the column voltages.

Accordingly, the capacitance of the odd columns injects the same magnitude of charge onto the test row 620 as the capacitance of the even columns. As shown, during time period T2, the integrator output remains substantially unchanged, indicating that the injected charge is balanced. The output remaining substantially unchanged shows that the columns having received the positive test pulse (even columns) inject the same magnitude of charge as the columns having received the negative test pulse (odd columns). This indicates that the potential offset voltage applied to the test row 620 is equal to the unknown offset voltage to be determined. Accordingly, the offset voltage is found to be equal to the potential offset voltage applied to the test row 620 when the integrator output does not change in response to the equal and opposite test pulses applied to the even and odd columns.

In some embodiments, the above sequence is repeated with reversed polarities for the pulses applied to the even and odd columns.

The embodiment of FIG. 22 shows a simple linear search, however, other search algorithms can be used. For example a binary search can be used.

Using approximations similar to those discussed above with regard to FIG. 20, the test time for the embodiment of FIG. 22 is estimated as about 16 ms for each polarity, 32 ms total.

Figure 23:
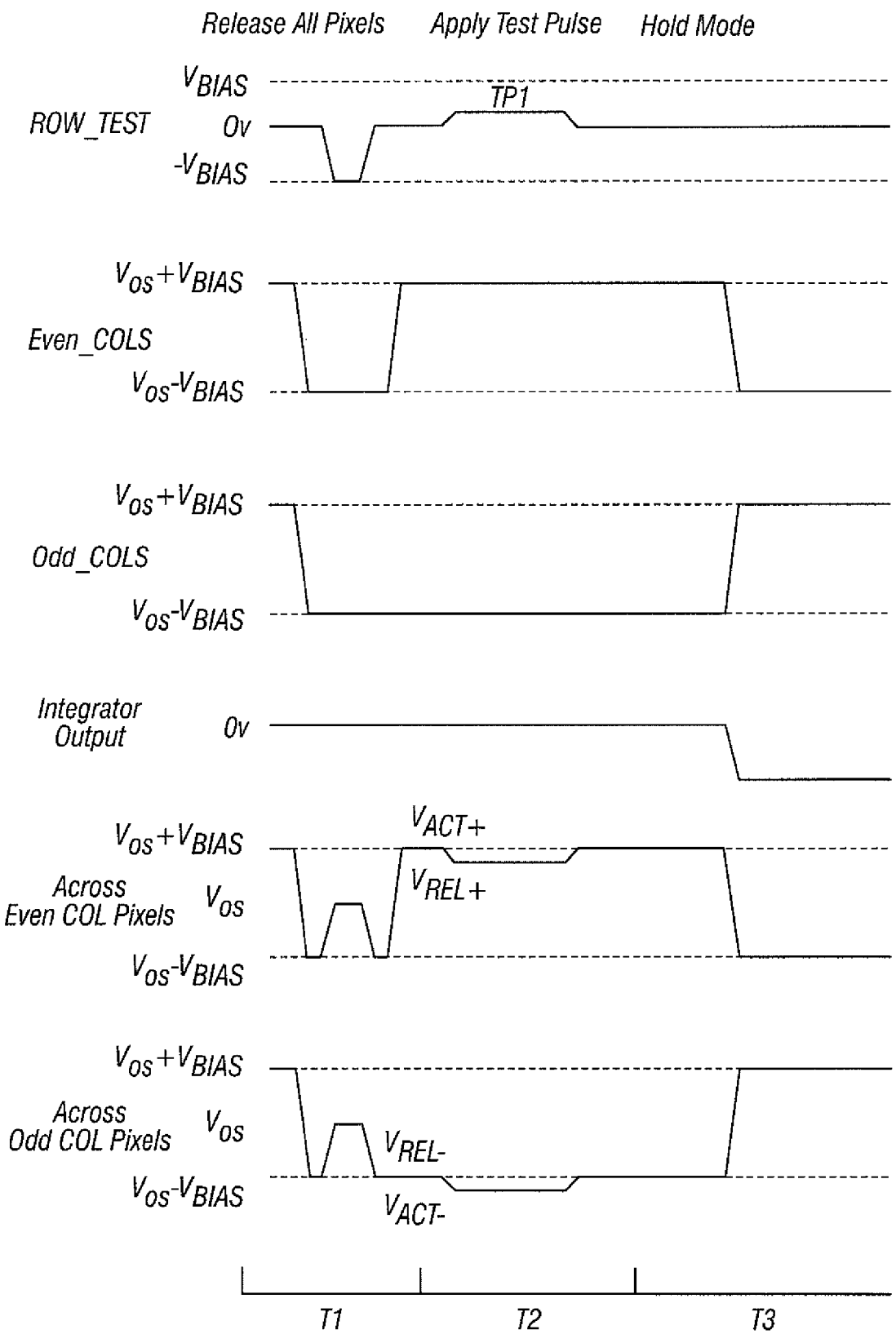
FIGS. 23 and 24 are timing diagrams illustrating additional measurement methods.
Figure 24:
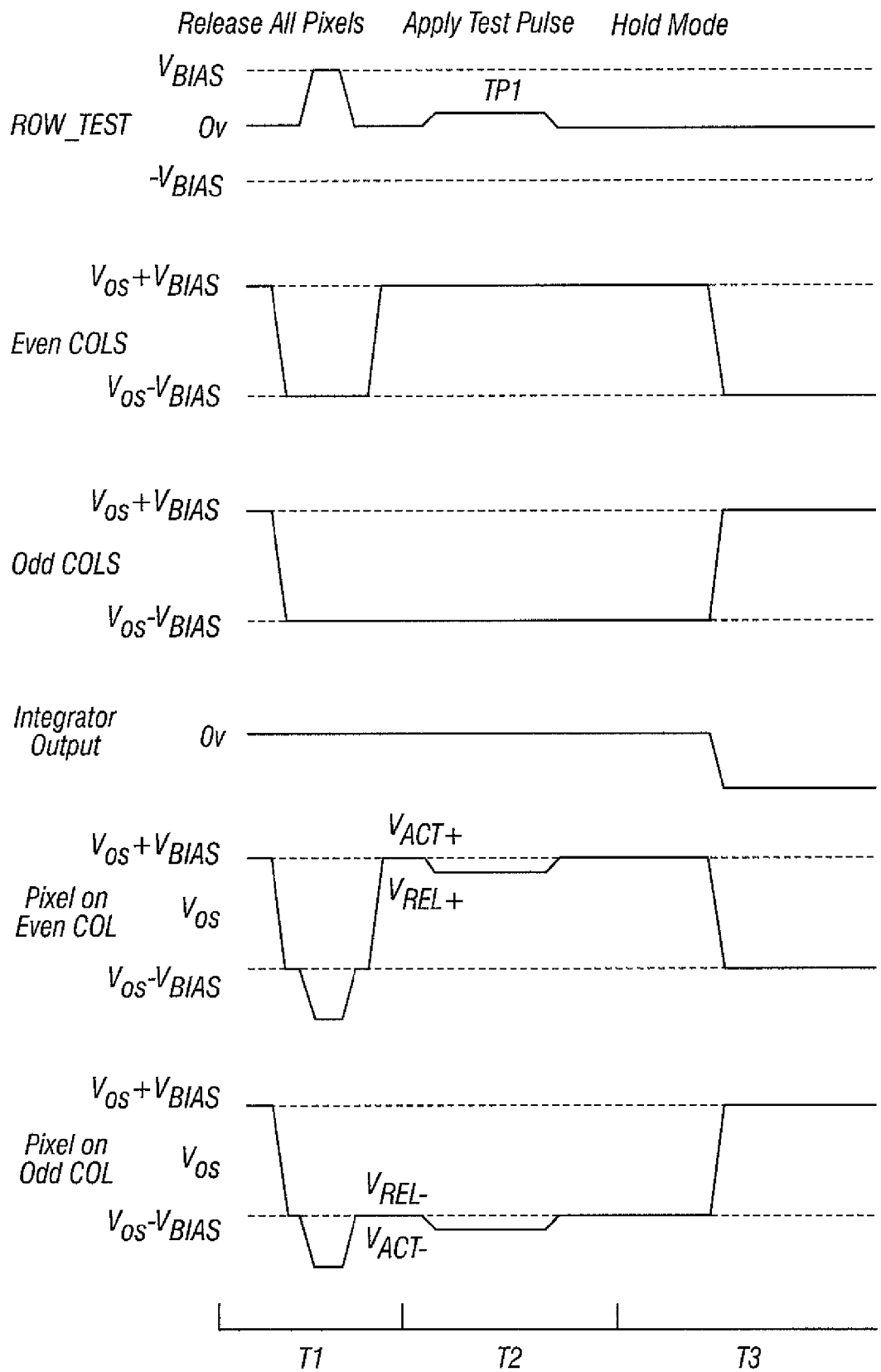

FIGS. 23 and 24 show voltages on test row 620, even columns, odd columns, the integrator output, and show voltage differences across pixels of the even and odd columns. The embodiments shown in FIGS. 23 and 24 are used to determine actuation and release margins, respectively. In each of these embodiments, the pixels of the test row 620 are initialized to an actuated or a release state. A test pulse is subsequently applied to the test row 620 while the columns have a hold voltage believed to be in the middle of the hysteresis window. The even columns have a positive hold voltage and the odd columns have a negative hold voltage. The test pulse applied to the test row 620 causes the voltage difference between the row and column electrodes of each of the pixels to either increase (potentially causing released pixels to actuate) or to decrease (potentially causing actuated pixels to release). Following the application of the test pulse, the polarity of the hold voltages is reversed so that the even columns then have a negative hold voltage and the odd columns have a positive hold voltage. During the reversal of the hold voltage polarities, the integrator output indicates any imbalance in the charge injected onto the test row. Imbalance above a threshold indicates that the test pulse applied to the test row 620 caused some of the pixels to change state. Accordingly, actuation and release margins are determined.

As shown in FIG. 23, during time period T1, all pixels are released. In this embodiment, the pixels are released by applying a negative bias voltage −Vbias to the test row 620 and applying the negative bias voltage −Vbias plus an offset voltage Vos to the even and odd columns. As shown, the voltage across the pixels of the even and odd columns is equal to the offset voltage Vos. Consequently, the pixels release. Other methods of releasing the pixels may also be used.

During time period T2, the even columns are driven with a positive hold voltage equal to a positive hold voltage +Vbias plus the offset voltage Vos, the odd columns are driven with a negative hold voltage equal to the negative bias voltage −Vbias plus the offset voltage Vos, and the test row 620 is driven with a positive test pulse TP1. If the test pulse TP1 is higher than the actuation margin, then the pixels of the odd columns will actuate because the voltage across the pixels of the odd columns is increased by the test pulse TP1.

Following the application of test pulse TP1, during time period T3, the hold voltages of the even and odd columns are reversed. The even columns transition from the positive hold voltage to the negative hold voltage, and the odd columns transition from the negative hold voltage to the positive hold voltage. As shown, during these transitions, the integrator 650 senses an imbalance in the charge injected onto the test row 620 as a result of the transitions. As discussed above, the imbalance indicates that the even and odd pixels have different capacitance, and are therefore, in different actuation/hold states. Therefore, it is determined that the test pulse TP1 caused at least some of the pixels of the odd columns to actuate.

The process can be repeated with a negative test pulse to determine the actuation margin for the pixels of the even column which have the positive hold voltage.

Based on the actuations induced by the test pulses, the panel offset and bias may be adjusted. For example, if both positive and negative test pulses induce actuations, then the bias voltage is too close to both positive and negative actuation voltages. If actuation is induced by only one test pulse, then the offset may need adjustment.

The test pulse amplitude may be selected such that the amplitude matches the minimum required voltage margin between the hold state voltage and the actuation voltage in order to accommodate any cross-talk effects or potential non-uniformity across the rest of the panel. The test pulse duration is selected such that the pixels have time to respond. Since the applied voltage is much smaller than the normal pixel drive voltage for actuation, the test pulse may be significantly longer than the normal panel line time.

As shown in FIG. 24, during time period T1, all pixels are actuated. In this embodiment, the pixels are actuated by applying a positive bias voltage +Vbias to the test row 620 and applying a negative bias voltage −Vbias plus an offset voltage Vos to the even and odd columns. As a result, the voltage across the pixels of the even and odd columns is equal to twice the bias voltage Vbias plus the offset voltage Vos. Consequently, the pixels actuate. Other methods of actuating the pixels may also be used.

During time period T2, the even columns are driven with a positive hold voltage equal to a positive hold voltage +Vbias plus the offset voltage Vos, the odd columns are driven with a negative hold voltage equal to the negative bias voltage −Vbias plus the offset voltage Vos, and the test row 620 is driven with a positive test pulse TP1. If the test pulse TP1 is higher than the release margin, then the pixels of the even columns will release because the voltage across the pixels of the odd columns is decreased by the test pulse TP1.

Following the application of test pulse TP1, during time period T3, the hold voltages of the even and odd columns are reversed. The even columns transition from the positive hold voltage to the negative hold voltage, and the odd columns transition from the negative hold voltage to the positive hold voltage. As shown, during these transitions, the integrator 650 senses an imbalance in the charge injected onto the test row 620 as a result of the transitions. As discussed above, the imbalance indicates that the even and odd pixels have different capacitance, and are therefore, in different actuation/hold states. Therefore, it is determined that the test pulse TP1 caused at least some of the pixels of the even columns to release.

The process can be repeated with a negative test pulse to determine the release margin for the pixels of the even column which have the positive hold voltage.

Based on the releases induced by the test pulses, the panel offset and bias may be adjusted. For example, if both positive and negative test pulses induce releases, then the bias voltage is too close to both positive and negative release voltages. If release is induced by only one test pulse, then the offset may need adjustment.

The test pulse amplitude may be selected such that the amplitude matches the minimum required voltage margin between the hold state voltage and the release voltage in order to accommodate any cross-talk effects or potential non-uniformity across the rest of the panel. The test pulse duration is selected such that the pixels have time to respond. Since the applied voltage is much smaller than the normal pixel drive voltage for actuation, the test pulse may be significantly longer than the normal panel line time.

In some embodiments, the measurements of FIGS. 23 and 24 are run with several test pulse amplitudes, the actual switching voltages can be determined and the optimum offset and bias voltages can be set.

If the test row is used to display images in normal operation, then image content may be lost during the test. In some embodiments, the test is run between image frames. For example, the test row can be used for calibration just prior to the test row receiving data for image display. Accordingly, the disturbance of the image data for the row may be of such a short duration, that the disturbance to the viewer is not significant. For example, the test may end less than about 100 ms, about 50 ms, about 20 ms, about 10 ms, about 5 ms or about 1 ms before the test row is to be written with image data. In some embodiments, alternating actuation and release tests can make the frequency high enough that flashing caused by the testing will not be detectable.

Running a full test using the sequences shown in FIGS. 23 and 24 may use eight test pulses (actuation and release, positive and negative polarity, odd and even segments). If each test requires 1 ms (including test pulse width, integrator settling time and overhead), then the complete cycle is completed in 8 ms.

The methods discussed above are based on minimum matching between the test pixels and the display pixels. In some embodiments, the test pixels and the display pixels may be interlaced. Imperfections in the matching will result in an offset in the integrator output that can be accommodated by various methods, including digital post-processing and correlated double sampling.

As an example, if each of the even and odd columns of the test row contains 64 pixels, and the variation in a single pixel capacitance is $\Delta C$ (measured from the average of all the pixels along the test row), and assuming that the variation in pixels is normal and uncorrelated, then the variation in the capacitance of the full group is approximately $\sqrt{64} \times \Delta C = 8 \times \Delta C$. Thus, if $\Delta C$ is 5% of the pixel capacitance, then the variation for the group is about 40% of a single pixel capacitance. At worst, the mis-match between the two groups is still less than a single pixel capacitance.

The descriptions above and simplified timing diagrams suggest that charge injected from the odd and even segment pixels is always balanced during the integration sequence, i.e. that the balancing charges are injected at the same time and at the same rate. In practice, this will not be the case. The odd and even segment transition times will vary with the display image, for example, leading to different injection rates. In some embodiments, the output of the integrator is sampled only after all the injected charge has been integrated. In some embodiments, the integrator has sufficient range to allow for the extremes in imbalance. For example, the integrator can be designed to have enough headroom to accommodate all of one polarity charge before the other polarity is integrated. The integrator can have a ±1v output swing, which accommodates a 128 column display, where the signal from a single pixel is ~10 mV (assuming a 3:1 ratio between actuated and released pixel capacitance).

In some embodiments, the column switching is staggered. Portions of the odd and even columns are switched at the same time, and if the separation in time between the portions is large enough then any difference between the rise and fall time need only be accommodated for an individual group.

In some embodiments, the techniques described above are applied to a full panel where all the rows are connected to the integrator input. In some embodiments, the change in state of a single pixel in the entire array is detectable. However, the amount of headroom required to deal with the worst-case difference between the rise and fall times of the segment lines is now much larger; if the same (very pessimistic) assumption that all the charge from one transition must be integrated before the other, then the single pixel signal has only about 30 µV. However, if the measurement is made over the whole panel, the image content may be fully controlled so as to constrain the difference in positive-going and negative-going segment transitions. Staggering of the column switching can also be used.

The methods described above are outlined with respect to a bi-chrome display. However, they can also be applied to a color displays. The test row can have all three color pixels within it. The switching voltages for each can be measured independently. In some embodiments, only the segments corresponding to the color being tested are switched. The other color pixels remain released and the corresponding injected charges balanced. In some embodiments, the test pulse(s) are applied to all three color pixels simultaneously, and switching of the odd and even columns is staggered by color so that state detection occurs individually by color.

Figure 17:
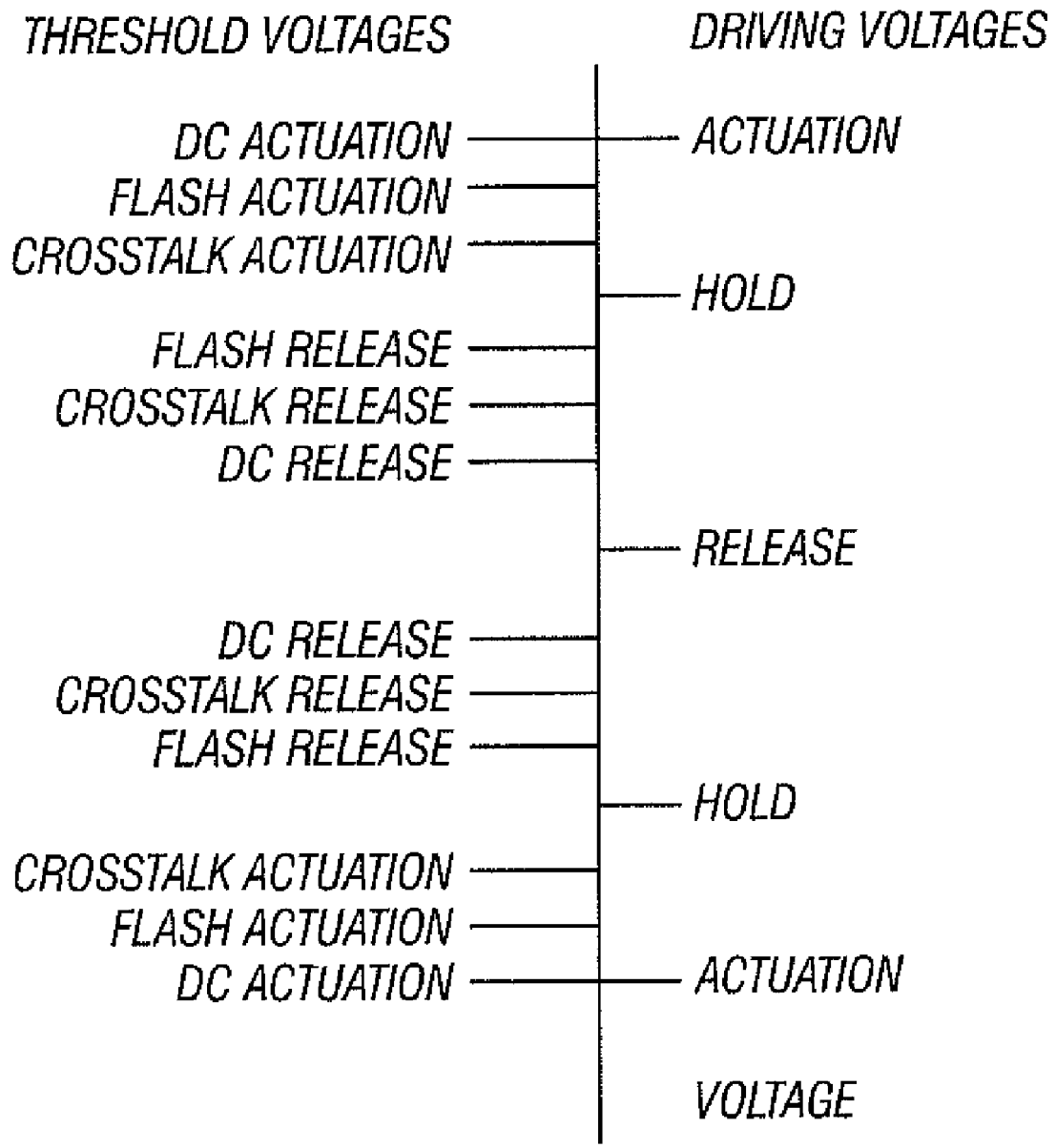
FIG. 17 is a voltage axis with driving voltages determined based on measured threshold voltage values.

Once the threshold voltages are measured, driving voltages to optimally drive the interferometric modulators can be calculated. As discussed earlier, there are five input voltage difference ranges. Each of these input voltage difference ranges may be determined based on the thresholds measured. For example, the positive actuation voltage may be determined to be the greatest value of the positive actuation thresholds—DC, flash, and crosstalk. The positive hold voltage may be the average of the least positive actuation threshold and the greatest positive release voltage. The negative actuation voltage may be determined to be the least value of the negative actuation thresholds. The negative hold voltage may be the average of the greatest negative actuation threshold and the least negative release voltage. The release voltage may be the average of the positive actuation voltage and the negative actuation voltage. In some embodiments, the determined driving voltage may be a measured threshold value plus a margin value. These measured threshold values and determined driving voltages are shown graphically in FIG. 17. The vertical axis is voltage, and voltages labeled on the left of the axis are measured threshold voltages, and the voltages labeled on the right of the axis are driving voltages calculated based on the measured threshold voltages.

While the above detailed description has shown, described, and pointed out novel features as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of measuring a threshold voltage for a microelectromechanical system (MEMS) device, the method comprising:
    applying a plurality of voltage transitions to the device and sensing an amount of charge applied to the device during one or more transitions;
    determining, based on the amount of charge sensed, whether each of the one or more transitions changes the state of the device;
    determining the threshold voltage based at least in part on a transition resulting in a state change.

2. The method of claim 1, wherein the voltage transitions are applied to the MEMS device with a dedicated driver.

3. The method of claim 2, further comprising determining a release threshold voltage based at least in part on a transition resulting in the device changing from an actuated state to a released state.

4. The method of claim 3, wherein the release threshold voltage is a DC threshold voltage.

5. The method of claim 3, wherein the transitions each have a starting voltage and an ending voltage, and the starting and ending voltages have the same polarity.

6. The method of claim 2, further comprising determining an actuation threshold voltage based at least in part on a transition resulting in the device changing from a released state to an actuated state.

7. The method of claim 6, wherein the actuation threshold voltage is a DC threshold voltage.

8. The method of claim 2, further comprising determining an actuation threshold voltage based at least in part on a particular transition resulting in the device changing from a released state to an actuated state, the particular transition having a starting voltage and an ending voltage, the starting and ending voltages having opposite polarities.

9. The method of claim 8, wherein the actuation threshold voltage is about equal to the ending voltage of the particular transition.

10. The method of claim 8, wherein the starting voltage and the ending voltage have substantially equal magnitude with respect to an offset voltage.

11. The method of claim 8, wherein the actuation threshold voltage is a flash threshold voltage.

12. The method of claim 8, further comprising:
    determining a second threshold prior to applying the transitions; and
    determining at least one of the starting voltage and the ending voltage of at least one transition based on the second threshold.

13. The method of claim 12, wherein the second threshold is a DC threshold, and the actuation threshold voltage is a flash threshold voltage.

14. The method of claim 2, further comprising determining a release threshold voltage based at least in part on a particular transition resulting in the device changing from an actuated state to a released state, the particular transition having a starting voltage and an ending voltage, the starting and ending voltages having opposite polarities.

15. The method of claim 14, wherein the release threshold voltage is about equal to the ending voltage of the particular transition.

16. The method of claim 14, wherein the starting voltage and the ending voltage have substantially equal magnitude with respect to an offset voltage.

17. The method of claim 14, wherein the release threshold voltage is a flash threshold voltage.

18. The method of claim 14, further comprising:
    determining a second threshold prior to applying the transitions; and
    determining at least one of the starting voltage and the ending voltage of at least one transition based on the second threshold.

19. The method of claim 18, wherein the second threshold voltage is a DC threshold voltage, and the release threshold voltage is a flash threshold voltage.

20. The method of claim 2, the device comprising a plurality of elements, the method further comprising determining a release threshold voltage of a first element based at least in part on a particular transition applied to a second element resulting in the first element changing from a released to an actuated state.

21. The method of claim 20, wherein the release threshold voltage is about equal to the ending voltage of the particular transition.

22. The method of claim 20, wherein the device comprises an array of elements, and the first element is in a first column of the array and the second element is in a second column of the array.

23. The method of claim 22, wherein the first and second elements are in the same row of the array.

24. The method of claim 20, wherein the device comprises an array of elements, and the first and second elements are separated from the array.

25. The method of claim 20, wherein the release threshold voltage is a crosstalk threshold voltage.

26. The method of claim 20, further comprising:
determining a second threshold prior to applying the transitions; and
determining at least one of the starting voltage and the ending voltage of at least one transition based on the second threshold.

27. The method of claim 26, wherein the second threshold is a DC threshold, and the release threshold voltage is a crosstalk threshold voltage.

28. The method of claim 27, wherein the second threshold is a DC threshold, the third threshold is a flash threshold, and the release threshold voltage is a crosstalk threshold voltage.

29. The method of claim 26, wherein the second threshold is a flash threshold, and the release threshold voltage is a crosstalk threshold voltage.

30. The method of claim 20, further comprising:
determining a second threshold prior to applying the transitions;
determining a third threshold prior to applying the transitions, the third threshold being determined subsequent to determining the second threshold; and
determining at least one of the starting voltage and the ending voltage of at least one transition based on the third threshold.

31. The method of claim 2, the device comprising a plurality of elements, the method further comprising determining an actuation threshold voltage of a first element based at least in part on a particular transition applied to a second element resulting in the first element changing from an actuated state to a released state.

32. The method of claim 31, wherein the actuation threshold voltage is about equal to the ending voltage of the particular transition 33. The method of claim 31, wherein the actuation threshold voltage is a crosstalk threshold voltage.

34. The method of claim 31, further comprising:
determining a second threshold prior to applying the transitions; and
determining at least one of the starting voltage and the ending voltage of at least one transition based on the second threshold.

35. The method of claim 34, wherein the second threshold is a DC threshold, and the actuation threshold voltage is a crosstalk threshold voltage.

36. The method of claim 34, wherein the second threshold is a flash threshold, and the actuation threshold voltage is a crosstalk threshold voltage.

37. The method of claim 31, further comprising:
determining a second threshold prior to applying the transitions;
determining a third threshold prior to applying the transitions, the third threshold being determined subsequent to determining the second threshold; and
determining at least one of the starting voltage and the ending voltage of at least one transition based on the third threshold.

38. The method of claim 37, wherein the second threshold is a DC threshold, the third threshold is a flash threshold, and the actuation threshold voltage is a crosstalk threshold voltage.

39. The method of claim 1, wherein the voltage transitions are applied to the MEMS device in response to the MEMS device being turned on.

40. The method of claim 1, wherein determining the threshold voltage comprises determining a voltage sufficient to cause a movable element of the device to move.

41. The method of claim 1, wherein sensing the charge comprises integrating a current applied to the device.

42. The method of claim 1, wherein sensing the charge comprises measuring current applied to the device.

43. The method of claim 1, wherein sensing the charge comprises at least one of digitally integrating a signal and analog integrating a signal.

44. The method of claim 1, further comprising:
connecting a terminal of the device to a ground and applying an initialization voltage, wherein the device is thereafter in an initial state;
connecting the terminal of the device to an integrator circuit prior to applying the plurality of voltage transitions; and
sensing the charge with the integrator circuit.

45. The method of claim 44, further comprising:
connecting the terminal of the device to a first integrator prior to a positive voltage transition;
sensing the charge with the first integrator circuit to determine a first threshold;
connecting the terminal of the device to a second integrator prior to a negative voltage transition; and
sensing the charge with the second integrator circuit to determine a second threshold.

46. The method of claim 1, wherein the device comprises a plurality of elements, the method further comprising:
applying a plurality of voltage transitions to each of the elements and sensing an amount of charge applied to the device during one or more transitions;
determining, based on the amount of charge sensed, whether each of the one or more transitions changes the state of a determined number of elements; and
determining the threshold voltage based at least in part on a transition resulting in a state change of the determined number of elements.

47. The method of claim 1, further comprising:
sensing the charge applied to the device while applying one or more positive voltage transitions to the device;
applying a test voltage to the device;
sensing the charge applied to the device while applying one or more negative voltage transitions to the device; and
determining whether the test voltage changed the state of the device based on the difference between the charge sensed for positive voltage transitions and the charge sensed for negative voltage transitions.

48. The method of claim 1, wherein the device comprises an array of elements and the plurality of transitions comprises positive voltage transitions and negative voltage transitions, the method further comprising:
applying positive voltage transitions to a first portion of the array; and
applying negative voltage transitions to a second portion of the array; and determining whether the state of a number of elements changed based on the difference between the charge sensed for positive voltage transitions and the charge sensed for negative voltage transitions.

49. The method of claim 48, wherein the first and second portions of the array each comprise one or more columns, and each of the columns of the first portion is adjacent to at least one column of the second portion.

50. The method of claim 1, wherein the threshold voltage is one of an actuation threshold and a release threshold, and the method further comprises:
  determining that a state change has occurred;
  determining a next voltage transition to apply, the next voltage transition determined so as to measure a second threshold, the second threshold being the other of the actuation threshold and the release threshold; and
  applying the next transition to the device.

51. The method of claim 1, wherein the threshold voltage is one of a positive threshold and a negative threshold, and the method further comprises:
  determining a second threshold, the second threshold being the other of the positive threshold and the negative threshold; and
  determining an offset voltage, wherein the offset voltage is substantially the average of the positive threshold and the negative threshold.

52. The method of claim 1, further comprising determining one or more driving voltages based on the measured threshold voltage.

53. The method of claim 1, wherein the device comprises an array of elements and the plurality of transitions comprises positive voltage transitions and negative voltage transitions, the method further comprising:
  applying a positive voltage transition to a first portion of the array; and
  applying a negative voltage transition to a second portion of the array,
  wherein sensing the amount of charge applied to the device comprises sensing a difference between charge induced by the positive voltage transition and charge induced by the negative voltage transition.

54. The method of claim 53, wherein the positive voltage transition and the negative voltage transition are applied substantially simultaneously.

55. The method of claim 53, further comprising:
  applying a first reference voltage to the entire array while applying the positive and negative transitions;
  sensing a first difference between the charge induced by the positive voltage transition and the charge induced by the negative voltage transition;
  applying a second reference voltage to the entire array while applying additional positive and negative transitions;
  sensing a second difference between the charge induced by the additional positive voltage transition and the charge induced by the additional negative voltage transition;
  comparing the first and second differences; and
  determining an offset voltage to be equal to the reference voltage associated with the minimum of the first and second differences.

56. The method of claim 53, further comprising:
  initializing the elements of the array to a first state;
  applying a first transition to the first portion of the array;
  applying a second transition to the second portion of the array, wherein the polarities of the first and second transitions are opposite;
  sensing a difference between charge induced by the first transition and charge induced by the second transition;
  after applying the first and second transitions, reinitializing the elements of the array to the first state;
  after reinitializing the elements of the array, applying a third transition to the first portion of the array; and
  after reinitializing the elements of the array, applying a fourth transition to the second portion of the array, wherein the polarities of the third and fourth transitions are opposite; and
  sensing a difference between charge induced by the third transition and charge induced by the fourth transition.

57. The method of claim 56, wherein the first transition and the second transition are applied substantially simultaneously, and the third transition and the fourth transition are applied substantially simultaneously.

58. The method of claim 53, further comprising:
  initializing the elements of the array to a released state;
  applying a series of positive voltage transitions of different magnitudes to the first portion of the array;
  applying a series of negative voltage transitions of different magnitudes to the second portion of the array,
  wherein determining the threshold comprises determining an actuation threshold based the magnitudes of the positive and negative transitions and on whether the transitions having the magnitudes changes the state of the device to an actuated state.

59. The method of claim 58, wherein the positive voltage transitions are applied at substantially the same time as the negative voltage transitions.

60. The method of claim 53, further comprising:
  initializing the elements of the array to a first state;
  applying a first transition to the first portion of the array, wherein the first transition causes the elements of the first portion to be in the first state;
  applying a second transition to the second portion of the array, wherein the polarities of the first and second transitions are opposite; and
  determining whether the second transition caused the elements of the second portion of the array to change states by sensing a difference between charge induced by the first transition and charge induced by the second transition.

61. The method of claim 60, wherein the first transition and the second transition are applied substantially simultaneously.

62. The method of claim 53, further comprising:
  initializing the elements of the array to an actuated state;
  applying a series of positive voltage transitions of different magnitudes to the first portion of the array;
  applying a series of negative voltage transitions of different magnitudes to the second portion of the array,
  wherein determining the threshold comprises determining an actuation threshold based the magnitudes of the positive and negative transitions and on whether the transitions having the magnitudes changes the state of the device to a released state.

63. The method of claim 62, wherein the positive voltage transitions are applied at substantially the same time as the negative voltage transitions.

64. The method of claim 53, further comprising:
  applying a first reference voltage to the entire array while applying the positive and negative transitions;
  sensing a first difference between the charge induced by the positive voltage transition and the charge induced by the negative voltage transition;

applying a second reference voltage to the entire array while applying additional positive and negative transitions;

sensing a second difference between the charge induced by the additional positive voltage transition and the charge induced by the additional negative voltage transition;

comparing the first and second differences; and determining an offset voltage to be equal to the reference voltage associated with the minimum of the first and second differences.

65. A MEMS device, comprising:

a pair of electrodes;

a driver configured to apply a plurality of voltage transitions across the electrodes;

a sensor configured to indicate an amount of charge applied to the electrodes during one or more transitions;

a comparison circuit configured to determine, based on the amount of charge sensed, whether each of the transitions changes the state of the device; and a processor configured to determine a threshold voltage based at least in part on a transition resulting in a state change.

66. The MEMS device of claim 65, wherein the driver is dedicated to the MEMS device.

67. The MEMS device of claim 65, wherein the driver is configured to apply the voltage transitions to the MEMS device in response to the MEMS device being turned on.

68. The MEMS device of claim 65, wherein the sensor is further configured to integrate a current applied to the device.

69. The MEMS device of claim 65, wherein the sensor is further configured to measure current applied to the device.

70. The MEMS device of claim 65, wherein the sensor is further configured to at least one of digitally integrate a signal and analog integrate a signal.

71. The MEMS device of claim 65, wherein:

the sensor comprises an integrator circuit, and the driver is further configured to apply an initialization voltage to the electrodes, wherein the device is thereafter in an initial state, and to thereafter connect one of the electrodes to the integrator circuit prior to applying the plurality of voltage transitions, wherein the integrator circuit is configured to sense the charge applied to the electrodes during the voltage transitions.

72. The MEMS device of claim 71, wherein:

the integrator circuit comprises first and second integrators;

the driver is configured to connect the one electrode to the first integrator prior to a positive voltage transition;

the sensor is configured to sense charge applied to the one electrode with the first integrator circuit during the positive voltage transition;

the processor is configured to determine a first threshold based on the charge sensed during the positive voltage transition;

the driver is further configured to connect the one electrode to the second integrator prior to a negative voltage transition;

the sensor is further configured to sense charge applied to the one electrode with the second integrator circuit during the negative voltage transition;

the processor is further configured to determine a second threshold based on the charge sensed during the negative voltage transition.

73. The MEMS device of claim 65, further comprising a plurality of elements, wherein:

the driver is further configured to apply a plurality of voltage transitions to each of the elements;

the sensor is further configured to sense charge applied to the electrodes during one or more transitions;

the processor is further configured to determine, based on the amount of charge sensed, whether each of the one or more transitions changes the state of a determined number of elements and to determine a second threshold based on the charge sensed during a transition resulting in a state change of the determined number of elements.

74. The MEMS device of claim 65, wherein:

the driver is further configured to apply one or more positive voltage transitions to the electrodes, apply a test voltage to the electrodes, and apply one or more negative voltage transitions to the electrodes;

the sensor is configured to sense the charge applied to the electrodes at least during the applications of the one or more positive voltage transitions and the one or more negative voltage transitions to the electrodes; and the processor is further configured to determine whether the test voltage changed the state of the device based on the difference between the charge sensed for positive voltage transitions and the charge sensed for negative voltage transitions.

75. The MEMS device of claim 65, further comprising an array of elements and the transitions comprise positive voltage transitions and negative voltage transitions, wherein the driver is further configured to apply one or more positive voltage transitions to a first portion of the array and to apply one or more negative voltage transitions to a second portion of the array, and the comparison circuit is configured to determine whether the state of a number of elements changed based on the difference between the charge sensed for positive voltage transitions and the charge sensed for negative voltage transitions.

76. The MEMS device of claim 75, wherein the first and second portions of the array each comprise one or more columns, and each of the columns of the first portion is adjacent to at least one column of the second portion.

77. The MEMS device of claim 65, wherein the threshold voltage is one of an actuation threshold and a release threshold, and the processor is configured to determine a next voltage transition to apply, the next voltage transition determined so as to measure a second threshold, the second threshold being the other of the actuation threshold and the release threshold, and the driver is configured to apply the next transition to the device.

78. The MEMS device of claim 65, wherein the threshold voltage is one of a positive threshold and a negative threshold, and the processor is configured to determine a second threshold, the second threshold being the other of the positive threshold and the negative threshold and to determine an offset voltage, wherein the offset voltage is substantially equal to the average of the positive threshold and the negative threshold.

79. The MEMS device of claim 65, wherein the transitions each have a starting voltage and an ending voltage, and the starting and ending voltages have the same polarity.

80. The MEMS device of claim 79, wherein the threshold voltage is a DC release threshold voltage.

81. The MEMS device of claim 79, wherein the actuation threshold voltage is a DC actuation threshold voltage.

82. The MEMS device of claim 65, the processor further configured to determine an actuation threshold voltage based at least in part on a particular transition resulting in the device changing from a released state to an actuated state, the particular transition having a starting voltage and an ending voltage, the starting and ending voltages having opposite polarities.

83. The MEMS device of claim 82, wherein the actuation threshold voltage is a flash threshold voltage.

84. The MEMS device of claim 82, wherein the processor is further configured to determine a second threshold prior to the driver applying the transitions and to determine at least one of the starting voltage and the ending voltage of at least one transition based on the second threshold.

85. The MEMS device of claim 84, wherein the second threshold is a DC threshold, and the actuation threshold voltage is a flash threshold voltage.

86. The MEMS device of claim 65, wherein the processor is configured to determine a release threshold voltage based at least in part on a particular transition resulting in the device changing from an actuated state to a released state, the particular transition having a starting voltage and an ending voltage, the starting and ending voltages having opposite polarities.

87. The MEMS device of claim 86, wherein the release threshold voltage is a flash threshold voltage.

88. The MEMS device of claim 86, wherein the processor is configured to determine a second threshold prior to the driver applying the transitions and to determine at least one of the starting voltage and the ending voltage of at least one transition based on the second threshold.

89. The MEMS device of claim 88, wherein the second threshold voltage is a DC threshold voltage, and the release threshold voltage is a flash threshold voltage.

90. The MEMS device of claim 65, further comprising a plurality of elements, wherein the processor is configured to determine a release threshold voltage of a first element based at least in part on a particular transition applied to a second element resulting in the first element changing from a released to an actuated state.

91. The MEMS device of claim 90, wherein the device comprises an array of elements, and the first element is in a first column of the array and the second element is in a second column of the array.

92. The MEMS device of claim 91, wherein the first and second elements are in the same row of the array.

93. The MEMS device of claim 90, wherein the device comprises an array of elements, and the first and second elements are separated from the array.

94. The MEMS device of claim 90, wherein the release threshold voltage is a crosstalk threshold voltage.

95. The MEMS device of claim 90, wherein the processor is configured to determine a second threshold prior to applying the transitions and to determine at least one of the starting voltage and the ending voltage of at least one transition based on the second threshold.

96. The MEMS device of claim 95, wherein the second threshold is a DC threshold, and the release threshold voltage is a crosstalk threshold voltage.

97. The MEMS device of claim 95, wherein the second threshold is a flash threshold, and the release threshold voltage is a crosstalk threshold voltage.

98. The MEMS device of claim 90, wherein the processor is configured to determine second and third thresholds prior to the driver applying the transitions, the third threshold being determined subsequent to determining the second threshold and to determine at least one of the starting voltage and the ending voltage of at least one transition based on the third threshold.

99. The MEMS device of claim 98, wherein the second threshold is a DC threshold, the third threshold is a flash threshold, and the release threshold voltage is a crosstalk threshold voltage.

100. The MEMS device of claim 65, further comprising a plurality of elements, the processor configured to determine an actuation threshold voltage of a first element based at least in part on a particular transition applied to a second element resulting in the first element changing from an actuated state to a released state.

101. The MEMS device of claim 100, wherein the actuation threshold voltage is a crosstalk threshold voltage.

102. The MEMS device of claim 100, wherein the processor is configured to determine a second threshold prior to applying the transitions and to determine at least one of the starting voltage and the ending voltage of at least one transition based on the second threshold.

103. The MEMS device of claim 102, wherein the second threshold is a DC threshold, and the actuation threshold voltage is a crosstalk threshold voltage.

104. The MEMS device of claim 102, wherein the second threshold is a flash threshold, and the actuation threshold voltage is a crosstalk threshold voltage.

105. The MEMS device of claim 100, wherein the processor is configured to determine second and third thresholds prior to applying the transitions, the third threshold being determined subsequent to determining the second threshold, and to determine at least one of the starting voltage and the ending voltage of at least one transition based on the third threshold.

106. The MEMS device of claim 105, wherein the second threshold is a DC threshold, the third threshold is a flash threshold, and the actuation threshold voltage is a crosstalk threshold voltage.

107. The MEMS device of claim 65, further comprising determining one or more driving voltages based on the measured threshold voltage.

108. The apparatus of claim 65, further comprising:
a display;
a second processor that is configured to communicate with said display, said second processor being configured to process image data; and
a memory device that is configured to communicate with said second processor.

109. The apparatus of claim 108, further comprising a driver circuit configured to send at least one signal to the display.

110. The apparatus of claim 109, further comprising a controller configured to send at least a portion of the image data to the driver circuit.

111. The apparatus of claim 108, further comprising an image source module configured to send said image data to said second processor.

112. The apparatus of claim 111, wherein the image source module comprises at least one of a receiver, transceiver, and transmitter.

113. The apparatus of claim 108, further comprising an input device configured to receive input data and to communicate said input data to said second processor.

114. A MEMS device configured to be driven to an actuated state as a result of being driven with an actuation voltage, to be driven to a released state as a result of being driven with a release voltage, and to maintain a current state as a result of being driven with a hold voltage, the device comprising:
first and second means for actuating and releasing according to a voltage;
means for applying a plurality of voltage transitions to the first and second actuating and releasing means;
means for indicating an amount of charge applied to the device during one or more transitions;

means for determining, based on the amount of charge sensed, whether each of the one or more transitions changes the state of the device; and means for determining the threshold voltage based at least in part on a transition resulting in a state change.

115. The MEMS device of claim 114, wherein the first and second actuating and releasing means comprise electrodes.

116. The MEMS device of claim 115, wherein the applying means comprises a driver.

117. The MEMS device of claim 116, wherein the indicating means comprises a sensor.

118. The MEMS device of claim 117, wherein the state change determining means comprises a comparison circuit.

119. The MEMS device of claim 118, wherein the threshold voltage determining means comprises a processor.

120. The MEMS device of claim 114, wherein the applying means is dedicated to the MEMS device.

121. The MEMS device of claim 114, wherein the applying means is configured to apply the voltage transitions to the MEMS device in response to the MEMS device being turned on.

122. The MEMS device of claim 114, wherein the indicating means is further configured to at least one of digitally integrate a signal and analog integrate a signal.

123. The MEMS device of claim 114, wherein:
the indicating means comprises an integrator circuit, and
the applying means is further configured to apply an initialization voltage to the actuating and releasing means, wherein the device is thereafter in an initial state, and to thereafter connect one of the actuating and releasing means to the integrator circuit prior to applying the plurality of voltage transitions, wherein the integrator circuit is configured to sense the charge applied to the actuating and releasing means during the voltage transitions.

124. The MEMS device of claim 123, wherein:
the integrator circuit comprises first and second integrators;
the applying means is configured to connect the one actuating and releasing means to the first integrator prior to a positive voltage transition;
the indicating means is configured to sense charge applied to the one actuating and releasing means with the first integrator circuit during the positive voltage transition;
the threshold voltage determining means is configured to determine a first threshold based on the charge sensed during the positive voltage transition;
the applying means is further configured to connect the one actuating and releasing means to the second integrator prior to a negative voltage transition;
the indicating means is further configured to sense charge applied to the one actuating and releasing means with the second integrator circuit during the negative voltage transition;
the threshold voltage determining means is further configured to determine a second threshold based on the charge sensed during the negative voltage transition.

125. The MEMS device of claim 114, further comprising a plurality of elements, wherein:
the applying means is further configured to apply a plurality of voltage transitions to each of the elements;
the indicating means is further configured to sense charge applied to the actuating and releasing means during one or more transitions;
the threshold voltage determining means is further configured to determine, based on the amount of charge sensed, whether each of the one or more transitions changes the state of a determined number of elements and to determine a second threshold based on the charge sensed during a transition resulting in a state change of the determined number of elements.

126. The MEMS device of claim 114, wherein:
the applying means is further configured to apply one or more positive voltage transitions to the actuating and releasing means, apply a test voltage to the actuating and releasing means, and apply one or more negative voltage transitions to the actuating and releasing means;
the indicating means is configured to sense the charge applied to the actuating and releasing means at least during the applications of the one or more positive voltage transitions and the one or more negative voltage transitions to the actuating and releasing means; and
the threshold voltage determining means is further configured to determine whether the test voltage changed the state of the device based on the difference between the charge sensed for positive voltage transitions and the charge sensed for negative voltage transitions.

127. The MEMS device of claim 114, further comprising an array of elements and the transitions comprise positive voltage transitions and negative voltage transitions, wherein the applying means is further configured to apply one or more positive voltage transitions to a first portion of the array and to apply one or more negative voltage transitions to a second portion of the array, and the state change determining means is configured to determine whether the state of a number of elements changed based on the difference between the charge sensed for positive voltage transitions and the charge sensed for negative voltage transitions.

128. The MEMS device of claim 114, wherein the threshold voltage is one of an actuation threshold and a release threshold, and the threshold voltage determining means is configured to determine a next voltage transition to apply, the next voltage transition determined so as to measure a second threshold, the second threshold being the other of the actuation threshold and the release threshold, and the applying means is configured to apply the next transition to the device.

129. The MEMS device of claim 114, wherein the threshold voltage is one of a positive threshold and a negative threshold, and the threshold voltage determining means is configured to determine a second threshold, the second threshold being the other of the positive threshold and the negative threshold and to determine an offset voltage, wherein the offset voltage is substantially equal to the average of the positive threshold and the negative threshold.

130. The MEMS device of claim 114, wherein the transitions each have a starting voltage and an ending voltage, and the starting and ending voltages have the same polarity.

131. The MEMS device of claim 130, wherein the threshold voltage is a DC release threshold voltage.

132. The MEMS device of claim 130, wherein the actuation threshold voltage is a DC actuation threshold voltage.

133. The MEMS device of claim 114, the threshold voltage determining means further configured to determine an actuation threshold voltage based at least in part on a particular transition resulting in the device changing from a released state to an actuated state, the particular transition having a starting voltage and an ending voltage, the starting and ending voltages having opposite polarities.

134. The MEMS device of claim 133, wherein the actuation threshold voltage is a flash threshold voltage.

135. The MEMS device of claim 133, wherein the threshold voltage determining means is further configured to determine a second threshold prior to the applying means applying the transitions and to determine at least one of the starting voltage and the ending voltage of at least one transition based on the second threshold.

136. The MEMS device of claim 135, wherein the second threshold is a DC threshold, and the actuation threshold voltage is a flash threshold voltage.

137. The MEMS device of claim 114, wherein the threshold voltage determining means is configured to determine a release threshold voltage based at least in part on a particular transition resulting in the device changing from an actuated state to a released state, the particular transition having a starting voltage and an ending voltage, the starting and ending voltages having opposite polarities.

138. The MEMS device of claim 137, wherein the release threshold voltage is a flash threshold voltage.

139. The MEMS device of claim 137, wherein the threshold voltage determining means is configured to determine a second threshold prior to the applying means applying the transitions and to determine at least one of the starting voltage and the ending voltage of at least one transition based on the second threshold.

140. The MEMS device of claim 139, wherein the second threshold voltage is a DC threshold voltage, and the release threshold voltage is a flash threshold voltage.

141. The MEMS device of claim 114, further comprising a plurality of elements, wherein the threshold voltage determining means is configured to determine a release threshold voltage of a first element based at least in part on a particular transition applied to a second element resulting in the first element changing from a released to an actuated state.

142. The MEMS device of claim 141, wherein the device comprises an array of elements, and the first and second elements are separated from the array.

143. The MEMS device of claim 141, wherein the release threshold voltage is a crosstalk threshold voltage.

144. The MEMS device of claim 141, wherein the threshold voltage determining means is configured to determine a second threshold prior to applying the transitions and to determine at least one of the starting voltage and the ending voltage of at least one transition based on the second threshold.

145. The MEMS device of claim 144, wherein the second threshold is a DC threshold, and the release threshold voltage is a crosstalk threshold voltage.

146. The MEMS device of claim 144, wherein the second threshold is a flash threshold, and the release threshold voltage is a crosstalk threshold voltage.

147. The MEMS device of claim 141, wherein the threshold voltage determining means is configured to determine second and third thresholds prior to the applying means applying the transitions, the third threshold being determined subsequent to determining the second threshold and to determine at least one of the starting voltage and the ending voltage of at least one transition based on the third threshold.

148. The MEMS device of claim 147, wherein the second threshold is a DC threshold, the third threshold is a flash threshold, and the release threshold voltage is a crosstalk threshold voltage.

149. The MEMS device of claim 114, further comprising a plurality of elements, the threshold voltage determining means configured to determine an actuation threshold voltage of a first element based at least in part on a particular transition applied to a second element resulting in the first element changing from an actuated state to a released state.

150. The MEMS device of claim 149, wherein the actuation threshold voltage is a crosstalk threshold voltage.

151. The MEMS device of claim 149, wherein the threshold voltage determining means is configured to determine a second threshold prior to applying the transitions and to determine at least one of the starting voltage and the ending voltage of at least one transition based on the second threshold.

152. The MEMS device of claim 151, wherein the second threshold is a DC threshold, and the actuation threshold voltage is a crosstalk threshold voltage.

153. The MEMS device of claim 151, wherein the second threshold is a flash threshold, and the actuation threshold voltage is a crosstalk threshold voltage.

154. The MEMS device of claim 149, wherein the threshold voltage determining means is configured to determine second and third thresholds prior to applying the transitions, the third threshold being determined subsequent to determining the second threshold, and to determine at least one of the starting voltage and the ending voltage of at least one transition based on the third threshold.

155. The MEMS device of claim 154, wherein the second threshold is a DC threshold, the third threshold is a flash threshold, and the actuation threshold voltage is a crosstalk threshold voltage.

156. The MEMS device of claim 114, further comprising determining one or more driving voltages based on the measured threshold voltage.

157. The MEMS device of claim 114, wherein the device comprises an array of elements and the plurality of transitions comprises positive voltage transitions and negative voltage transitions, the device further comprising:
  means for applying a positive voltage transition to a first portion of the array; and
  means for applying a negative voltage transition to a second portion of the array,
  wherein the indicating means is configured to sense a difference between charge induced by the positive voltage transition and charge induced by the negative voltage transition.

158. The MEMS device of claim 157, wherein the applying means are configured to apply the positive voltage transition and the negative voltage transition substantially simultaneously.

159. The MEMS device of claim 157, further comprising:
  means for applying a first reference voltage to the entire array while applying the positive and negative transitions;
  means for sensing a first difference between the charge induced by the positive voltage transition and the charge induced by the negative voltage transition;
  means for applying a second reference voltage to the entire array while applying additional positive and negative transitions;
  means for sensing a second difference between the charge induced by the additional positive voltage transition and the charge induced by the additional negative voltage transition;
  means for comparing the first and second differences; and
  means for determining an offset voltage to be equal to the reference voltage associated with the minimum of the first and second differences.

160. The MEMS device of claim 157, further comprising:
  means for initializing the elements of the array to a first state;
  means for applying a first transition to the first portion of the array;
  means for applying a second transition to the second portion of the array, wherein the polarities of the first and second transitions are opposite;

means for sensing a difference between charge induced by the first transition and charge induced by the second transition;

means for reinitializing the elements of the array to the first state after applying the first and second transitions;

means for applying a third transition to the first portion of the array after reinitializing the elements of the array; and means for applying a fourth transition to the second portion of the array after reinitializing the elements of the array, wherein the polarities of the third and fourth transitions are opposite; and means for sensing a difference between charge induced by the third transition and charge induced by the fourth transition.

161. The MEMS device of claim 160, wherein the applying means are configured to apply the first transition and the second transition substantially simultaneously, and to apply the third transition and the fourth transition substantially simultaneously.

162. The MEMS device of claim 157, further comprising:
means for initializing the elements of the array to a released state;
means for applying a series of positive voltage transitions of different magnitudes to the first portion of the array;
means for applying a series of negative voltage transitions of different magnitudes to the second portion of the array,
wherein the determining means is configured to determine an actuation threshold based the magnitudes of the positive and negative transitions and on whether the transitions having the magnitudes changes the state of the device to an actuated state.

163. The MEMS device of claim 162, wherein the applying means are configured to apply the positive voltage transitions at substantially the same time as the negative voltage transitions.

164. The MEMS device of claim 114, further comprising:
means for initializing the elements of the array to a first state;
means for applying a first transition to the first portion of the array, wherein the first transition causes the elements of the first portion to be in the first state;
means for applying a second transition to the second portion of the array, wherein the polarities of the first and second transitions are opposite; and means for determining whether the second transition caused the elements of the second portion of the array to change states by sensing a difference between charge induced by the first transition and charge induced by the second transition.

165. The MEMS device of claim 164, wherein the applying means are configured to apply the first transition and the second transition substantially simultaneously.

166. The MEMS device of claim 114, further comprising:
means for initializing the elements of the array to an actuated state;
means for applying a series of positive voltage transitions of different magnitudes to the first portion of the array;
means for applying a series of negative voltage transitions of different magnitudes to the second portion of the array,
wherein the determining means is configured to determine an actuation threshold based the magnitudes of the positive and negative transitions and on whether the transitions having the magnitudes changes the state of the device to a released state.

167. The MEMS device of claim 166, wherein the applying means are configured to apply the positive voltage transitions at substantially the same time as the negative voltage transitions.

168. The MEMS device of claim 114, further comprising:
means for applying a first reference voltage to the entire array while applying the positive and negative transitions;
means for sensing a first difference between the charge induced by the positive voltage transition and the charge induced by the negative voltage transition;
means for applying a second reference voltage to the entire array while applying additional positive and negative transitions;
means for sensing a second difference between the charge induced by the additional positive voltage transition and the charge induced by the additional negative voltage transition;
means for comparing the first and second differences; and
means for determining an offset voltage to be equal to the reference voltage associated with the minimum of the first and second differences.

* * * * *

UNITED STATES PATENT AND TRADEMARK OFFICE
CERTIFICATE OF CORRECTION

PATENT NO. : 8,204,703 B2  
APPLICATION NO. : 12/369679  
DATED : June 19, 2012  
INVENTOR(S) : Alok Govil et al.

Page 1 of 1

It is certified that error appears in the above-identified patent and that said Letters Patent is hereby corrected as shown below:

In the Drawings:

At Sheet 17 of 21 (FIG. 20), Line 19 (Approx.), please delete "Outpt" and insert therefore --Output--.

In the Specifications:

At Column 1, Line 25, please delete "and or" and insert therefore --and/or--.

At Column 3, Line 5, please delete "FIGS" and insert therefore --FIGS.--.

At Column 14, Line 27, please delete "5B" and insert therefore --8B--.

At Column 16, Line 12, please delete "determined," and insert therefore --determined.--.

At Column 19, Line 63, please delete "Iout" and insert therefore --Iout--.

At Column 19, Line 65, please delete "Iout" and insert therefore --Iout--.

At Column 20, Line 45, please delete "do" and insert therefore --to--.

In the Claims:

At Column 33, Line 63, in Claim 1, please delete "device" and insert therefore --device; and--.

At Column 35, Line 47, in Claim 32, please delete "transition" and insert therefore --transition.--.

At Column 38, Line 25, in Claim 58, please delete "based" and insert therefore --on--.

At Column 38, Line 55, in Claim 62, please delete "based" and insert therefore --on--.

At Column 47, Line 29, in Claim 162, please delete "based" and insert therefore --on--.

At Column 48, Line 18, in Claim 166, please delete "based" and insert therefore --on--.

Signed and Sealed this  
Sixteenth Day of April, 2013

Teresa Stanek Rea  
*Acting Director of the United States Patent and Trademark Office*